United States Patent
Oosterhoff et al.

(10) Patent No.: US 10,852,633 B2
(45) Date of Patent: Dec. 1, 2020

(54) METHOD FOR MANUFACTURING A MEMBRANE ASSEMBLY

(71) Applicant: ASML NETHERLANDS B.V., Veldhoven (NL)

(72) Inventors: Sicco Oosterhoff, Nuenen (NL); Paul Janssen, Eindhoven (NL); Beatrijs Louise Marie-Joseph Katrien Verbrugge, Kasterlee (BE)

(73) Assignee: ASML Netherlands B.V., Veldhoven (NL)

( * ) Notice: Subject to any disclaimer, the term of this patent is extended or adjusted under 35 U.S.C. 154(b) by 222 days.

(21) Appl. No.: 15/771,634

(22) PCT Filed: Oct. 25, 2016

(86) PCT No.: PCT/EP2016/075605
§ 371 (c)(1),
(2) Date: Apr. 27, 2018

(87) PCT Pub. No.: WO2017/076686
PCT Pub. Date: May 11, 2017

(65) Prior Publication Data
US 2018/0321603 A1    Nov. 8, 2018

(30) Foreign Application Priority Data

Nov. 3, 2015  (EP) .................................. 15192788
Dec. 10, 2015  (EP) .................................. 15199167
May 25, 2016  (EP) .................................. 16171225

(51) Int. Cl.
*G03F 1/24*     (2012.01)
*G03F 7/20*     (2006.01)
*G03F 1/62*     (2012.01)
*G03F 1/64*     (2012.01)

(52) U.S. Cl.
CPC .................. *G03F 1/24* (2013.01); *G03F 1/62* (2013.01); *G03F 1/64* (2013.01); *G03F 7/70916* (2013.01); *G03F 7/70958* (2013.01); *G03F 7/70983* (2013.01)

(58) Field of Classification Search
CPC ..... G03F 1/24; G03F 1/62; G03F 1/64; G03F 7/70983; G03F 7/70916; G03F 7/70958
USPC ............................................................ 430/5
See application file for complete search history.

(56) References Cited

U.S. PATENT DOCUMENTS

| | | |
|---|---|---|
| 8,518,612 B2 | 8/2013 | Akiyama et al. |
| 9,599,912 B2 | 3/2017 | Osorio Oliveros |
| 2003/0031939 A1 | 2/2003 | Butschke et al. |
| 2008/0152873 A1 | 6/2008 | Koroanyanwu et al. |
| 2012/0045714 A1 | 2/2012 | Akiyama et al. |
| 2014/0370423 A1 | 12/2014 | Goldfarb |
| 2015/0160569 A1 | 6/2015 | Osorio Oliveros |
| 2015/0212434 A1 | 7/2015 | Lairson et al. |
| 2016/0048079 A1 | 2/2016 | Lee et al. |

FOREIGN PATENT DOCUMENTS

| | | |
|---|---|---|
| CN | 102405440 | 4/2012 |
| CN | 102955373 | 3/2013 |
| CN | 106206262 | 12/2016 |
| JP | 2000227653 | 8/2000 |
| JP | 2003-068641 | 3/2003 |
| JP | 2010-256434 | 11/2010 |
| JP | 2014-211474 | 11/2014 |
| KR | 20130088565 | 8/2013 |
| WO | 2013/152921 | 10/2013 |
| WO | 2016/171514 | 10/2016 |

OTHER PUBLICATIONS

Chinese Office Action issued in corresponding Chinese Patent Application No. 201680064056.0, dated Dec. 3, 2019.
International Search Report and Written Opinion dated Jan. 26, 2017 in corresponding International Patent Application No. PCT/EP2016/075605.
Taiwanese Office Action issued in corresponding Taiwanese Patent Application No. 105134682, dated May 26, 2020.
Japanese Office Action issued in corresponding Japanese Patent Application No. 2018-519686, dated Jun. 15, 2020.
Chinese Office Action issued in corresponding Chinese Patent Application No. 201680064056.0, dated Jul. 22, 2020.

*Primary Examiner* — Christopher G Young
(74) *Attorney, Agent, or Firm* — Pillsbury Winthrop Shaw Pittman LLP

(57) ABSTRACT

A method for manufacturing a membrane assembly for EUV lithography, the method including: providing a stack including a membrane layer between a supporting substrate and an attachment substrate, wherein the supporting substrate includes an inner region and a border region; processing the stack, including selectively removing the inner region of the supporting substrate, to form a membrane assembly comprising: a membrane formed from at least the membrane layer; and a support holding the membrane, the support formed at least partially from the border region of the supporting substrate. The attachment substrate can be bonded to the rest of the stack.

20 Claims, 22 Drawing Sheets

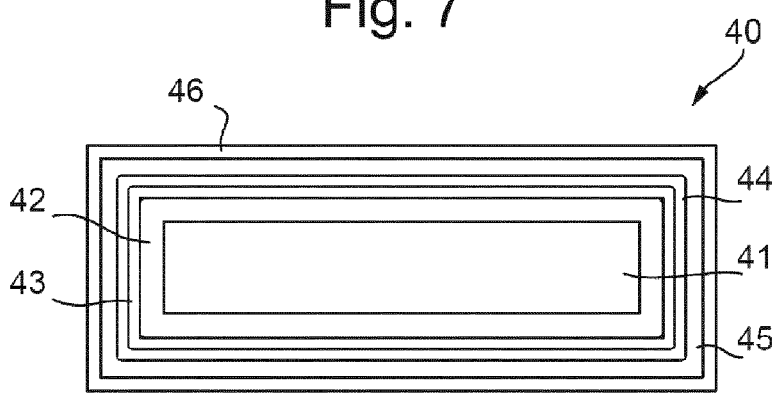
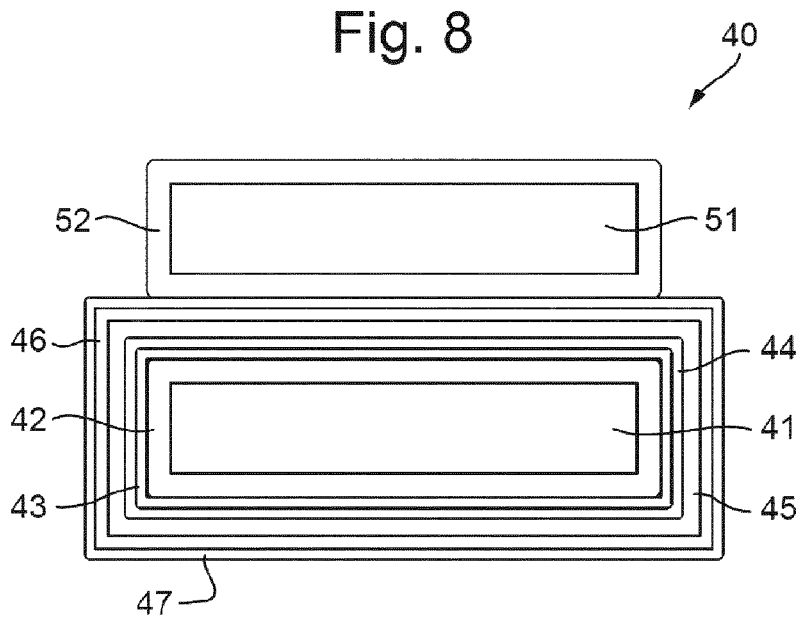

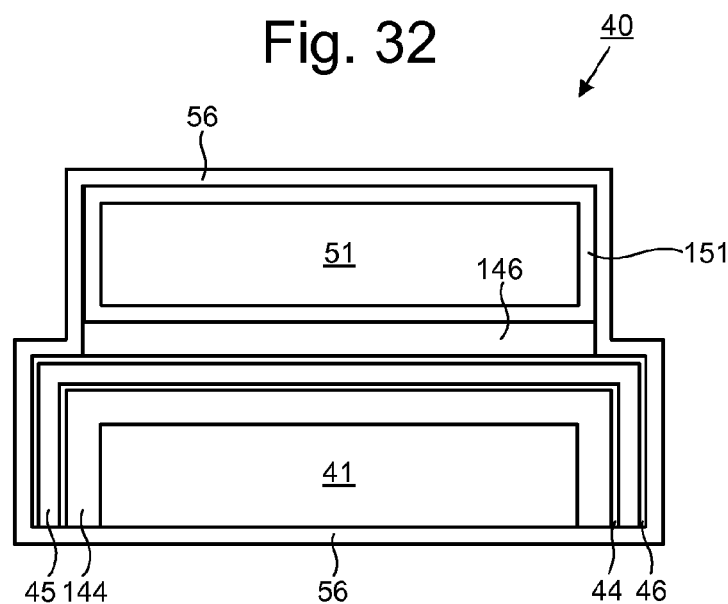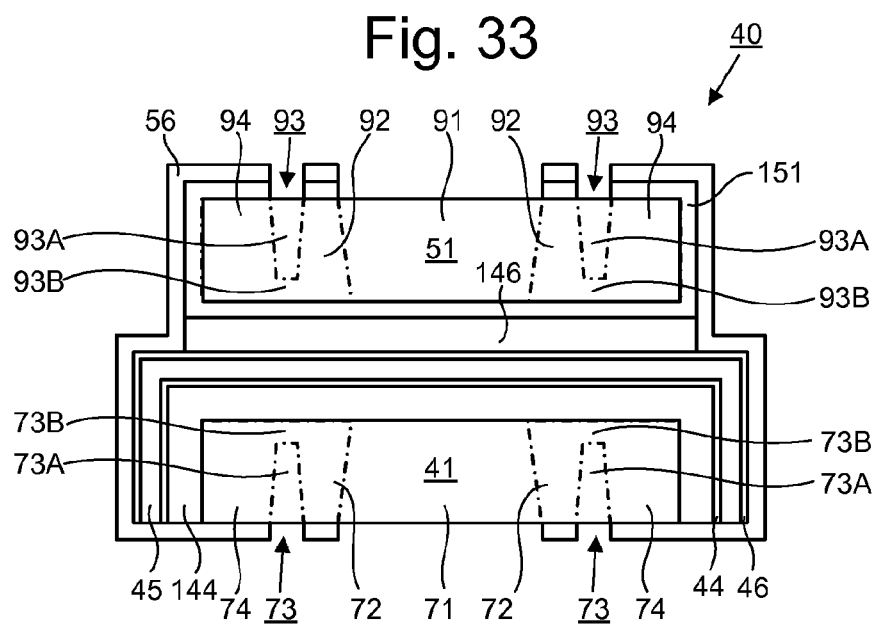

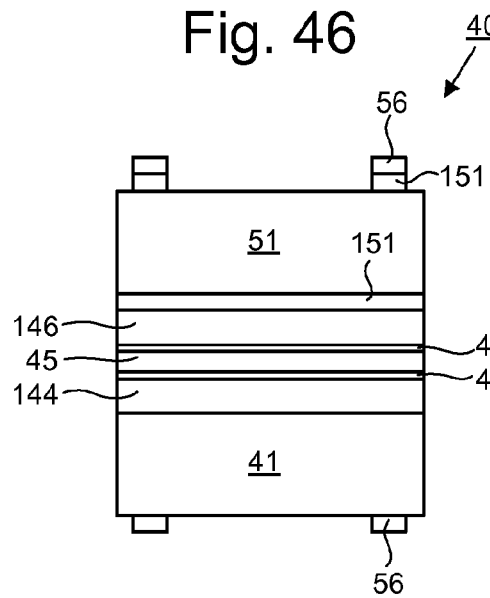
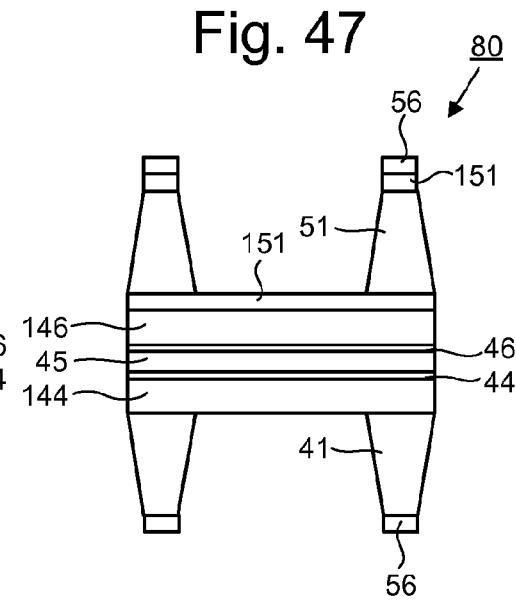
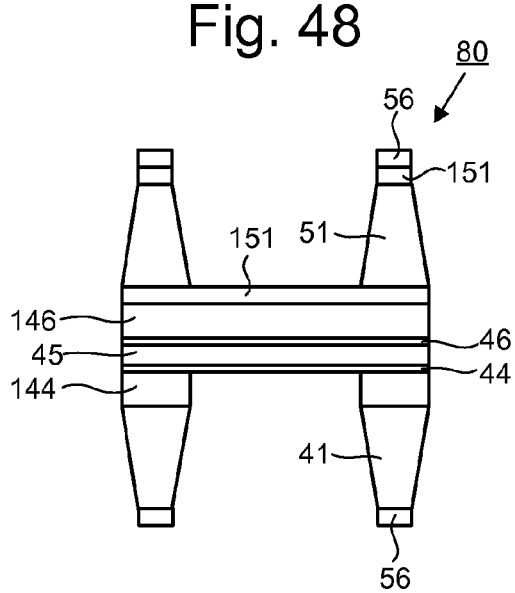
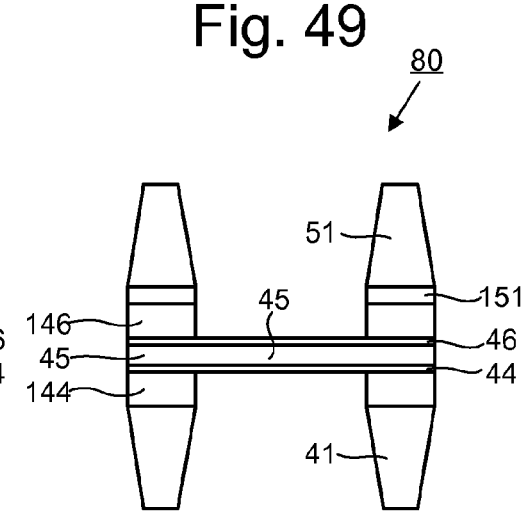

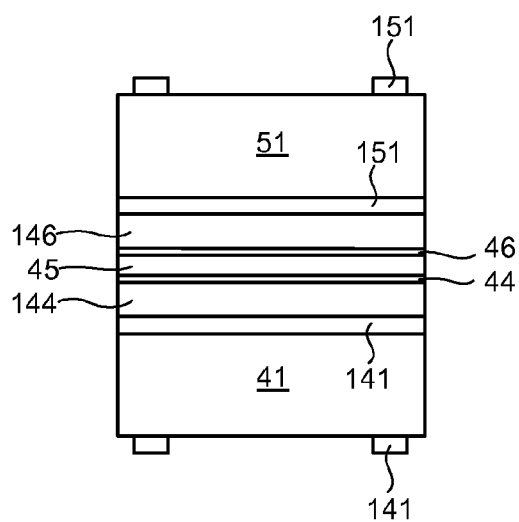
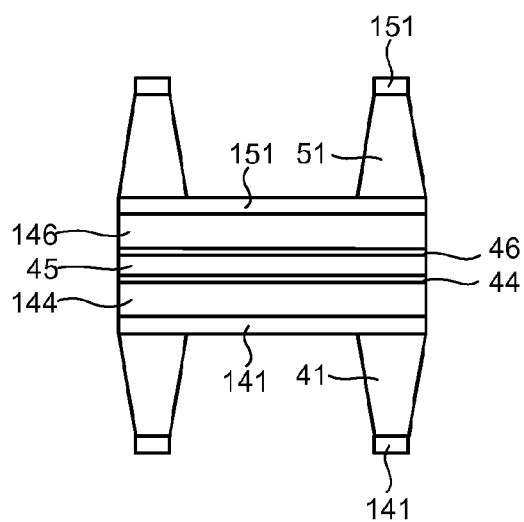
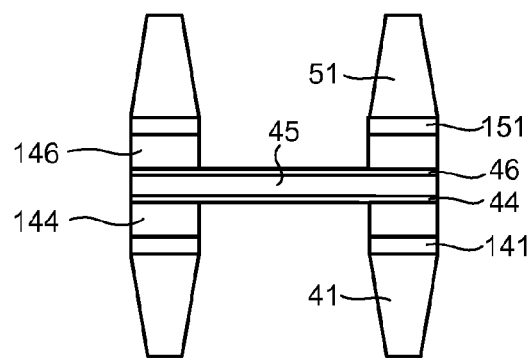

METHOD FOR MANUFACTURING A MEMBRANE ASSEMBLY

CROSS-REFERENCE TO RELATED APPLICATIONS

This application is the U.S. national phase entry of PCT patent application no. PCT/EP2016/075605, which was filed on Oct. 25, 2016, which claims the benefit of priority of European patent application no. 15192788.6, which was filed on Nov. 3, 2015, and European patent application no. 15199167.6, which was filed on Dec. 10, 2015, and European patent application no. 16171225.2, which was filed on May 25, 2016, each of which is are incorporated herein in its entirety by reference.

FIELD

The present invention relates to a method for manufacturing a membrane assembly, and to a membrane assembly.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process-dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

A lithographic apparatus includes a patterning device (e.g., a mask or a reticle). Radiation is provided through or reflected off the patterning device to form an image on a substrate. A membrane assembly may be provided to protect the patterning device from airborne particles and other forms of contamination. The membrane assembly for protecting the patterning device may be called a pellicle. Contamination on the surface of the patterning device can cause manufacturing defects on the substrate. The membrane assembly may comprise a border and a membrane stretched across the border. It is difficult to manufacture the membrane assembly without the membrane assembly being deformed in the process, for example because of the thinness of the membrane.

It is also difficult to manufacture the membrane assembly without the membrane assembly being damaged in the process. For example, the membrane may be undesirably oxidized during the process of manufacturing the membrane assembly.

It is desirable to reduce the possibility of a membrane assembly such as a pellicle being deformed or damaged during its manufacture. It is also desirable to reduce the time it takes to manufacture a membrane assembly.

SUMMARY OF THE INVENTION

According to an aspect of the invention, there is provided a method for manufacturing a membrane assembly for EUV lithography, the method comprising: providing a stack comprising a membrane layer between a supporting substrate and an attachment substrate, wherein the supporting substrate comprises an inner region and a first border region; processing the stack, including selectively removing the inner region of the supporting substrate, to form a membrane assembly comprising: a membrane formed from at least the membrane layer; and a support holding the membrane, the support formed at least partially from the first border region of the supporting substrate.

According to an aspect of the invention, there is provided a membrane assembly for EUV lithography, the membrane assembly comprising: a membrane; and a support holding the membrane, the support formed from a first border region of a supporting substrate and a second border region of an attachment substrate, wherein the membrane is between the first border region of the supporting substrate and the second border region of the attachment substrate; wherein the support is formed by selectively removing an inner region of the supporting substrate and a cover region of the attachment substrate such that the first border region of the supporting substrate and the second border region of the attachment substrate remain.

According to an aspect of the invention, there is provided a method for manufacturing a membrane assembly for a lithographic apparatus, the method comprising providing a supporting substrate having an average thickness of at least 600 μm, preferably at least 700 μm, with a membrane layer; wafer bonding an attachment substrate having an average thickness of less than 500 μm to the supporting substrate provided with the membrane layer to form a stack, wherein the membrane layer is encapsulated between the supporting substrate and the attachment substrate; and subsequently thinning the supporting substrate bonded to the attachment substrate to an average thickness of the supporting substrate to be less than 500 μm. Preferably the thickness of the supporting substrate and the thickness of the attachment substrate are substantially equal, in order to form a substantially symmetrical stack.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3 to 19 schematically depict stages of a method for manufacturing a pellicle according to an embodiment of the invention;

FIGS. 30 to 37 schematically depict stages of an alternative method for manufacturing a pellicle according to an embodiment of the invention;

FIGS. 46 to 49 schematically depict stages of an alternative method for manufacturing a pellicle according to an embodiment of the invention; and FIGS. 50 to 52 schematically depict stages of an alternative method for manufacturing a pellicle according to an embodiment of the invention;

Figure 1:
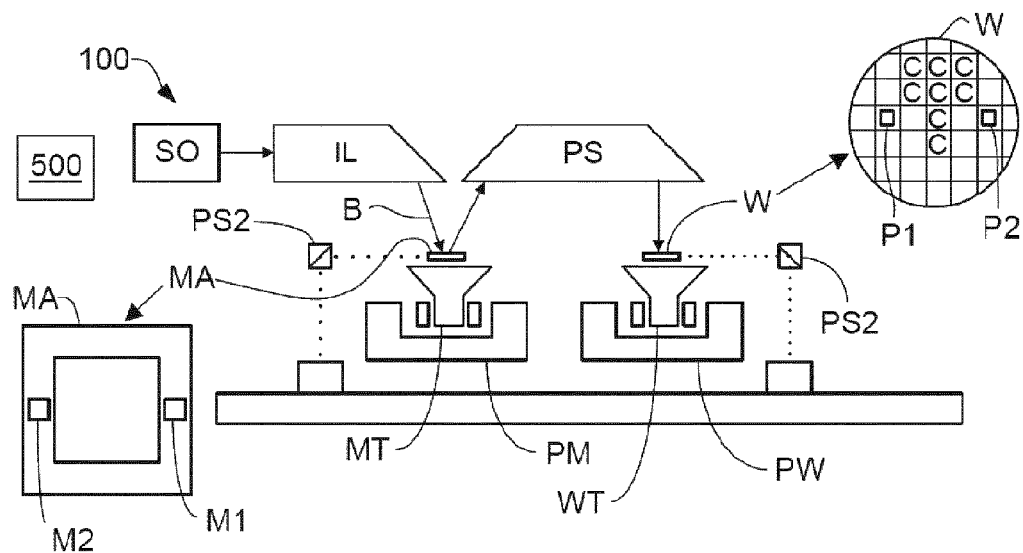
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

FIG. 1 schematically depicts a lithographic apparatus 100 including a source collector module SO according to one embodiment of the invention. The apparatus 100 comprises:
- an illumination system (or illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist-coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam B with a pattern in its cross-section such as to create a pattern in a target portion C of the substrate W. The pattern imparted to the radiation beam B may correspond to a particular functional layer in a device being created in the target portion C, such as an integrated circuit.

The patterning device MA may be transmissive or reflective. Examples of patterning devices include masks, programmable mirror arrays, and programmable liquid-crystal display (LCD) panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus 100 is of a reflective type (e.g., employing a reflective mask).

The lithographic apparatus 100 may be of a type having two (dual stage) or more substrate tables WT (and/or two or more support structures MT). In such a "multiple stage" lithographic apparatus the additional substrate tables WT (and/or the additional support structures MT) may be used in parallel, or preparatory steps may be carried out on one or more substrate tables WT (and/or one or more support structures MT) while one or more other substrate tables WT (and/or one or more other support structures MT) are being used for exposure.

Referring to FIG. 1, the illumination system IL receives an extreme ultraviolet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module SO may be separate entities, for example when a $CO_2$ laser is used to provide the laser beam for fuel excitation.

In such cases, the laser is not considered to form part of the lithographic apparatus 100 and the radiation beam B is passed from the laser to the source collector module SO with the aid of a beam delivery system comprising, for example, suitable directing mirrors and/or a beam expander. In other cases the source may be an integral part of the source collector module SO, for example when the source is a discharge produced plasma EUV generator, often termed as a DPP source.

The illumination system IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as facetted field and pupil mirror devices. The illumination system IL may be used to condition the radiation beam B, to have a desired uniformity and intensity distribution in its cross-section.

The radiation beam B is incident on the patterning device (e.g., mask) MA, which is held on the support structure (e.g., mask table) MT, and is patterned by the patterning device MA. After being reflected from the patterning device (e.g., mask) MA, the radiation beam B passes through the projection system PS, which focuses the radiation beam B onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. The patterning device (e.g., mask) MA and the substrate W may be aligned using mask alignment marks M1, M2 and substrate alignment marks P1, P2.

A controller 500 controls the overall operations of the lithographic apparatus 100 and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus 100. It will be appreciated that a one-to-one relationship between controlling computer and lithographic apparatus 100 is not necessary. In an embodiment of the invention one computer can control multiple lithographic apparatuses 100. In an embodiment of the invention, multiple networked computers can be used to control one lithographic apparatus 100. The controller 500 may also be configured to control one or more associated process devices and substrate handling devices in a lithocell or cluster of which the lithographic apparatus 100 forms a part. The controller 500 can also be configured to be subordinate to a supervisory control system of a lithocell or cluster and/or an overall control system of a fab.

Figure 2:
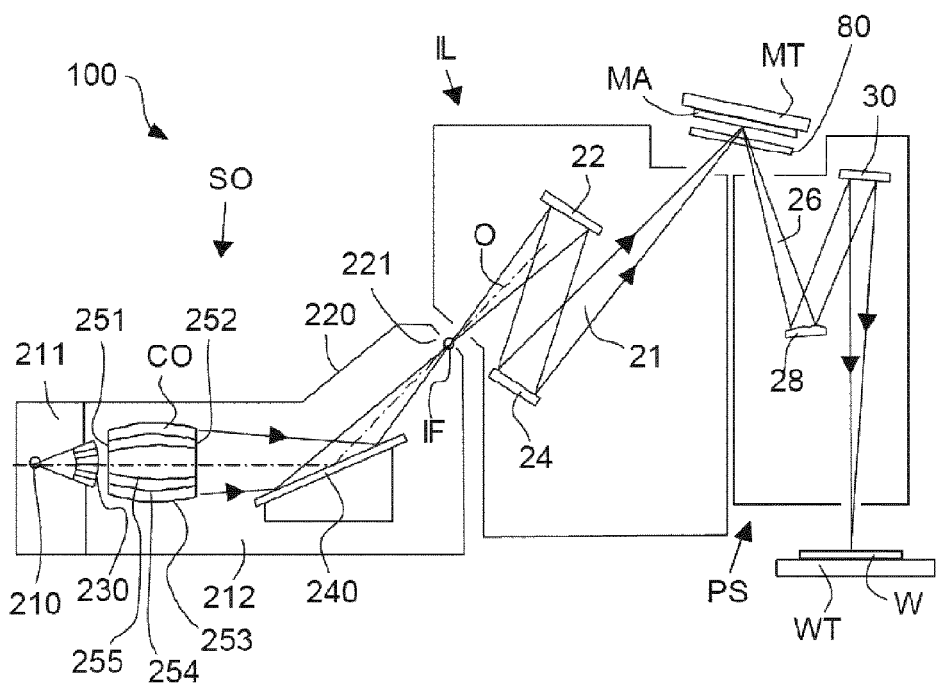
FIG. 2 is a more detailed view of the lithographic apparatus.

FIG. 2 shows the lithographic apparatus 100 in more detail, including the source collector module SO, the illumination system IL, and the projection system PS. An EUV radiation emitting plasma 210 may be formed by a plasma source. EUV radiation may be produced by a gas or vapor, for example Xe gas, Li vapor or Sn vapor in which the radiation emitting plasma 210 is created to emit radiation in the EUV range of the electromagnetic spectrum. In an embodiment, a plasma of excited tin (Sn) is provided to produce EUV radiation.

The radiation emitted by the radiation emitting plasma 210 is passed from a source chamber 211 into a collector chamber 212.

The collector chamber 212 may include a radiation collector CO. Radiation that traverses the radiation collector CO can be focused in a virtual source point IF. The virtual source point IF is commonly referred to as the intermediate focus, and the source collector module SO is arranged such that the virtual source point IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the unpatterned beam 21, at the patterning device MA, as well as a desired uniformity of radiation intensity at the patterning device MA. Upon reflection of the unpatterned beam 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in the illumination system IL and the projection system PS. Further, there may be more mirrors present than those shown in the Figures, for example there may be 1-6 additional reflective elements present in the projection system PS than shown in FIG. 2.

Alternatively, the source collector module SO may be part of an LPP radiation system.

As depicted in FIG. 1, in an embodiment the lithographic apparatus 100 comprises an illumination system IL and a projection system PS. The illumination system IL is configured to emit a radiation beam B. The projection system PS is separated from the substrate table WT by an intervening space. The projection system PS is configured to project a pattern imparted to the radiation beam B onto the substrate W. The pattern is for EUV radiation of the radiation beam B.

The space intervening between the projection system PS and the substrate table WT can be at least partially evacuated. The intervening space may be delimited at the location of the projection system PS by a solid surface from which the employed radiation is directed toward the substrate table WT.

In an embodiment the lithographic apparatus 100 comprises a dynamic gas lock. The dynamic gas lock comprises a membrane assembly 80. In an embodiment the dynamic gas lock comprises a hollow part covered by a membrane assembly 80 located in the intervening space. The hollow part is situated around the path of the radiation. In an embodiment the lithographic apparatus 100 comprises a gas blower configured to flush the inside of the hollow part with a flow of gas. The radiation travels through the membrane assembly before impinging on the substrate W.

In an embodiment the lithographic apparatus 100 comprises a membrane assembly 80. As explained above, in an embodiment the membrane assembly 80 is for a dynamic gas lock. In this case the membrane assembly 80 functions as a filter for filtering DUV radiation. Additionally or alternatively, in an embodiment the membrane assembly 80 is pellicle for the patterning device MA for EUV lithography. The membrane assembly 80 of the present invention can be used for a dynamic gas lock or for a pellicle or for another purpose such as a spectral purity filter. In an embodiment the membrane assembly 80 comprises a membrane, which may also be called a membrane stack. The membrane of the membrane assembly 80 comprises a membrane layer 45 and optionally capping films (described later). When the membrane of the membrane assembly 80 comprises the membrane layer 45 and at least one capping film (layer) then it may be called a membrane stack. The membrane layer 45 may also be a multilayer membrane layer 45 formed by a plurality of alternating layers of two or more different materials, in which case a capping film will have a different material than the alternating layers in the multilayer membrane layer 45. In an embodiment the membrane of the membrane assembly 80 is configured to transmit at least 80% of incident EUV radiation.

In an embodiment the pellicle is configured to seal off the patterning device MA to protect the patterning device MA from airborne particles and other forms of contamination. Contamination on the surface of the patterning device MA can cause manufacturing defects on the substrate W. For example, in an embodiment the pellicle is configured to reduce the likelihood that particles might migrate into a stepping field of the patterning device MA in the lithographic apparatus 100.

If the patterning device MA is left unprotected, the contamination can require the patterning device MA to be cleaned or discarded. Cleaning the patterning device MA interrupts valuable manufacturing time and discarding the patterning device MA is costly. Replacing the patterning device MA also interrupts valuable manufacturing time.

Figure 3:
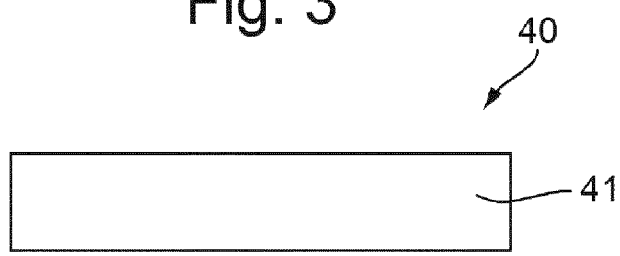
Figure 4:
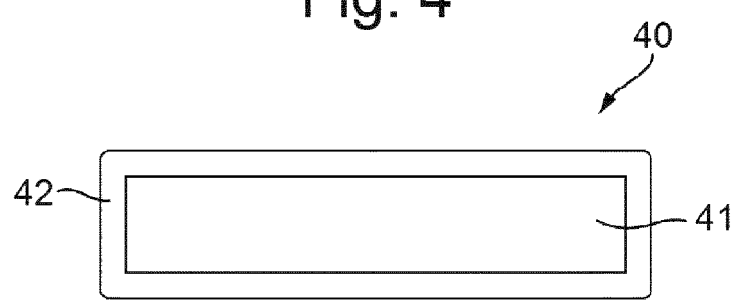

FIGS. 3 and 4 schematically depict stages of a method for manufacturing the membrane assembly 80 according to an embodiment of the invention. In an embodiment the method for manufacturing the membrane assembly 80 comprises providing a supporting substrate 41 for a stack 40.

In an embodiment the supporting substrate 41 is a wafer formed from silicon. The supporting substrate 41 has a shape such as a square, a circle or a rectangle, for example. The shape of the supporting substrate 41 is not particularly limited. The size of the supporting substrate 41 is not particularly limited. For example, in an embodiment the supporting substrate 41 has a diameter in the range of from about 100 mm to about 500 mm, for example about 200 mm. The thickness of the supporting substrate 41 is not particularly limited. For example, in an embodiment the supporting substrate 41 has a thickness of at least 300 μm, optionally at least 400 μm. In an embodiment the supporting substrate 41 has a thickness of at most 1,000 μm, optionally at most 800 μm. In an embodiment the supporting substrate 41 has a thickness of at most 600 μm, optionally at most 400 μm. In an embodiment the supporting substrate 41 has a thickness of about 400 μm. By providing a thinner supporting substrate 41, the amount of the supporting substrate 41 that needs to be selectively removed is reduced. Accordingly, by starting with a thinner supporting substrate 41, an embodiment of the invention is expected to reduce the possibility of the membrane being damaged or contaminated during the step of selectively removing parts of the supporting substrate 41. Additionally, by starting with a supporting substrate 41, an embodiment of the invention is expected to make the manufacturing process more efficient.

Silicon can crystallise in a diamond cubic crystal structure. In an embodiment the supporting substrate 41 comprises a cubic crystal of silicon. In an embodiment the supporting substrate 41 has a <100> crystallographic direction.

Figure 16:
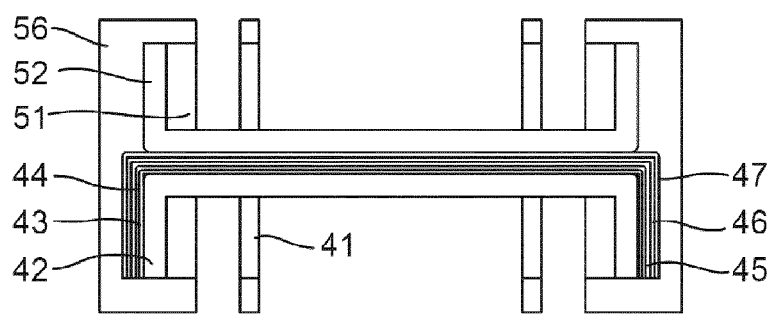

As depicted in FIG. 4, in an embodiment the supporting substrate 41 comprises a sacrificial layer. The sacrificial layer may be for example an oxidized layer 42. The oxidized layer 42 is part of the supporting substrate 41. The rest of the supporting substrate 41 forms a non-oxidized layer of the supporting substrate 41. The oxidized layer 42 forms an etch barrier when at least a part of the non-oxidized layer of the supporting substrate 41 is removed, for example is etched away. As depicted in FIG. 16, for example, the supporting substrate 41 is etched from the bottom side. The oxidized layer 42 is resistant to the wet etchant. In an embodiment the oxidized layer 42 can be replaced by an alternative sacrificial layer that is not an oxide layer.

In an embodiment the oxidized layer 42 has a thickness greater than 100 nm, optionally greater than 200 nm, and optionally greater than 300 nm. For example, in an embodiment the oxidized layer 42 has a thickness of about 350 nm or about 400 nm. An embodiment of the invention is expected to achieve an improved robustness in a step of etching at least part of the supporting substrate 41.

In an embodiment the oxidized layer 42 is formed as a thin layer of oxide on outer surfaces of the supporting substrate 41. In an embodiment the oxidized layer 42 is formed by a thermal oxidation process, for example as a thermal wet oxide. In an embodiment the oxidized layer 42 and the etchant used for etching at least part of the supporting substrate 41 are configured such that there is a good/high enough selectivity of the sacrificial layer (e.g. oxidized layer 42) with respect to the underlying layer (e.g. supporting substrate 41). For example, in an embodiment the etch rate of the oxidized layer 42 in the etchant is less than about 5 nm/minute, for example about 3 nm/minute. In an embodiment the oxidized layer 42 comprises amorphous silicon dioxide.

The oxidized layer 42 is optional. In an embodiment the oxidized layer 42 is not provided. If the oxidized layer 42 is not provided, an alternative etch stop may be provided, or the step of etching the supporting substrate 41 may be controlled such so as to reduce the possibility of part of the membrane of the membrane assembly 80 being undesirably etched away.

Figure 5:
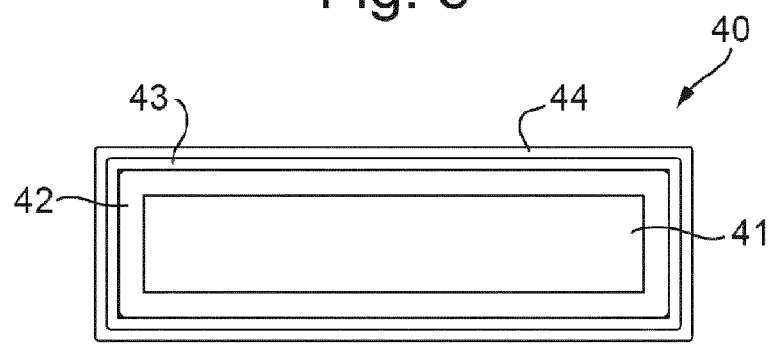

As depicted in FIG. 5, in an embodiment the stack 40 comprises a lower capping film 44. The lower capping film 44 is disposed between the supporting substrate 41 and the membrane layer 45. As depicted in FIG. 3, in an embodiment the stack 40 comprises an optional lower sacrificial layer 43. The lower sacrificial layer 43 is disposed between the supporting substrate 41 and the membrane layer 45.

When the stack 40 comprises the lower sacrificial layer 43, the lower capping film 44 is disposed between the lower sacrificial layer 43 and the membrane layer 45. In an embodiment the lower capping film 44 forms part of the membrane of the membrane assembly 80 produced by the method according to an embodiment of the invention.

The thickness of the lower sacrificial layer 43 is not particularly limited. In an embodiment the thickness of the lower sacrificial layer 43 is at least about 5 nm, and optionally at least about 10 nm. In an embodiment the thickness of the lower sacrificial layer 43 is at most about 100 nm, and optionally at most about 50 nm. In an embodiment the thickness of the lower sacrificial layer 43 is at most about 1000 nm and at least about 5 nm, but preferably at most 100 and at least 20 nm.

In an embodiment the lower sacrificial layer 43 is formed from a material such as amorphous silicon. However, this is not necessarily the case.

The method of depositing the lower sacrificial layer 43 onto the stack 40 is not particularly limited. In an embodiment the lower sacrificial layer 43 is applied to the stack 40 by chemical vapor deposition, for example low pressure chemical vapor deposition (LPCVD) or plasma-enhanced chemical vapor deposition (PECVD). LPCVD produces layers of relatively high quality while PECVD can desirably be effected at lower temperatures. For example, in an embodiment the lower sacrificial layer 43 is applied to the stack 40 by LPCVD at a temperature in a range from 300 to 700° C. However, this is not necessarily the case. For example, in an alternative embodiment the lower sacrificial layer 43 is applied to the stack 40 by PECVD, a sputtering method or by a thin film deposition method, for example.

In an embodiment, each of the lower capping film 44 and the upper capping film 46 has a thickness of less than 10 nm, preferably less than 4 nm. In an embodiment the combined thickness of the lower capping film 44, the membrane layer 45 and the upper capping film 46 is approximately 50 nm. In an embodiment the material for the upper capping film 46 is the same as the material for the lower capping film 44.

For example, in an embodiment the membrane layer 45 is formed from polycrystalline or nanocrystalline silicon. Polycrystalline or nanocrystalline silicon has a brittle nature. Hence, a membrane assembly 80 comprising a membrane that comprises a membrane layer 45 formed from polycrystalline or nanocrystalline silicon can shatter into many particles when the membrane assembly 80 breaks. An embodiment of the invention is expected to achieve an improvement in the mechanical properties of the membrane assembly 80.

Polycrystalline silicon and nanocrystalline silicon each have high transmission for EUV radiation. Polycrystalline silicon and nanocrystalline silicon each have good mechanical strength.

However, it is not essential for the membrane of the membrane assembly 80 to be formed from polycrystalline or nanocrystalline silicon. For example, in an alternative embodiment the membrane of the membrane assembly 80 is formed from a multi-lattice membrane or a silicon nitride. The membrane of the membrane assembly 80 is generally characterized to be formed from at least layer 45 and optionally one or more capping layers (on the top and/or the bottom of the membrane) with an individual thickness of the layers as well as a total thickness of the membrane (stack) being arranged such that is transparent to at least 80% of a desired radiation depending on the application field of the membrane assembly. The desired radiation may be EUV radiation, however depending on the specific application the desired radiation may also be (D)UV radiation, VIS radiation and/or IR radiation. In the latter cases, the desired transparency of the membrane to the desired wavelengths might deviate from 80% depending on the specific application. In case of IR radiation for example it is desirable to absorb more whereas in the D(UV) case it is desirable to have a very low reflection.

In a further alternative embodiment the membrane of the membrane assembly 80 is formed from monocrystalline silicon. In such an embodiment the monocrystalline silicon membrane can be formed by a silicon on insulator (SOI) technique. The starting material for this product is a so-called SOI wafer substrate. An SOI wafer substrate is a substrate comprising a silicon carrier substrate with a thin, monocrystalline silicon layer on top of a buried isolating $SiO_2$ layer. In an embodiment the thickness of the monocrystalline silicon layer can range between about 5 nm to about 5 µm. In an embodiment the silicon membrane layer is present on the SOI wafer substrate before the SOI wafer substrate is used in the method of manufacture.

In an embodiment the material for the lower capping film 44 is an amorphous silicon nitride. However, other materials may be suitable. In an embodiment the lower capping film 44 is thick enough to allow the lower capping film 44 to perform its function. In an embodiment the thickness of the lower capping film 44 is at least about 1 nm, and optionally at least about 2 nm. In an embodiment the lower capping film 44 is thin enough so that the membrane of the membrane assembly 80 including the lower capping film 44 has sufficiently good optical properties, particularly for transmission of EUV radiation. In an embodiment the thickness of the lower capping film 44 is at most about 10 nm, and optionally at most about 5 nm. In an embodiment the thickness of the lower capping film 44 is about 2.5 nm.

The method of applying the lower capping film 44 to the stack 40 is not particularly limited. In an embodiment the lower capping film 44 is applied to the stack by chemical vapor deposition, for example LPCVD at a temperature of about 850° C. However, in an alternative embodiment the lower capping film 44 is applied to the stack 40 by PECVD, a sputtering method or by a thin film deposition method, for example.

In an embodiment the lower capping film 44 and/or the upper capping film 46 is applied to the membrane layer 45 after the membrane layer 45 has been exposed by selective removal of at least part of the supporting substrate 41 (i.e. as a final or near-final step of manufacturing the membrane assembly 80).

As depicted in FIG. 6, the stack 40 comprises a membrane layer 45. The membrane assembly 80 comprises a membrane formed from the membrane layer 45 and optionally capping films (in a membrane stack). In an embodiment membrane layer 45 comprises silicon in one of its allotrope forms such as amorphous, monocrystalline, polycrystalline or nanocrystalline silicon. A nanocrystalline silicon means a polycrystalline silicon matrix containing a certain amorphous silicon content. In an embodiment polycrystalline or nanocrystalline silicon is formed by crystallizing amorphous silicon in the membrane layer 45. For example, as depicted in FIG. 6, in an embodiment a membrane layer 45 is added to the stack 40 as an amorphous silicon layer. The amorphous silicon layer crystallises into a polycrystalline or nanocrystalline silicon layer when a certain temperature is exceeded. For example, the membrane layer 45 as an amorphous silicon layer transforms into the membrane layer 45 as a polycrystalline or nanocrystalline silicon layer.

In an embodiment the amorphous silicon layer is in-situ doped during its growth. In an embodiment the amorphous silicon layer is doped after its growth. By adding a p- or n-type dopant the silicon conductivity increases, which has a positive effect on the thermomechanical behavior due to the power of the EUV source.

In an embodiment the membrane layer 45 is applied to both the top surface and the bottom surface of the stack 40. The membrane layer 45 can be removed from the bottom side of the stack 40 in a later process step. However, this is not necessarily the case. In an alternative embodiment the membrane layer 45 is applied only to the top side of the stack 40. The membrane layer 45 at the top side of the stack 40 becomes the membrane layer 45 in the membrane of the membrane assembly 80 produced by the manufacturing method.

In an embodiment the membrane layer 45 is applied to the stack 40 by a chemical vapor deposition method. For example, in an embodiment the membrane layer 45 is applied by LPCVD at a temperature of about 560° C. However, other methods such as PECVD, a sputtering method and a thin film deposition method can be used.

In an embodiment the membrane layer 45 is thin enough that its transmission for EUV radiation is sufficiently high, for example greater than 50%. In an embodiment the thickness of the membrane layer 45 is at most about 200 nm, and optionally at most about 150 nm. A 150 nm Si membrane would transmit about 77% of incident EUV radiation. In an embodiment the thickness of the membrane layer 45 is at most about 100 nm. A 100 nm Si membrane would transmit about 84% of incident EUV radiation. A 60 nm Si membrane would transmit about 90% of incident EUV radiation.

In an embodiment the membrane layer 45 is thick enough that it is mechanically stable when the membrane assembly 80 is fixed to the patterning device MA of the lithographic apparatus 100 and during use of the lithographic apparatus 100. In an embodiment the thickness of the membrane layer 45 is at least about 10 nm, optionally at least about 20 nm, and optionally at least about 35 nm. In an embodiment the thickness of the membrane layer 45 is about 55 nm.

As depicted in FIG. 8, in an embodiment the stack 40 comprises an attachment substrate 51. The membrane layer 45 is between the supporting substrate 41 and the attachment substrate 51. The attachment substrate 51 is self-supporting, i.e. it can support its own weight. When the attachment substrate 51 may be chosen to retain its shape even when is not supported by any other body. The attachment substrate 51 is different from for example a capping layer of material applied to the stack 40 and taking the shape of the stack (i.e. being conformal with the stack), which layer would not support its own weight if it was not applied to the stack 40.

The material of the attachment substrate 51 is not particularly limited. In an embodiment the attachment substrate 51 is formed from a material that can (but is not particularly limited to) be etched using the same etchant that is used to etch the supporting substrate 41. In an embodiment the attachment substrate 41 comprises silicon. The attachment substrate 51 has a shape corresponding to the shape of the supporting substrate 41. In an embodiment the attachment substrate 51 has a diameter similar or the same as the diameter of the supporting substrate 41.

The thickness of the attachment substrate 51 is not particularly limited. For example, in an embodiment the attachment substrate 51 has a thickness of at least 300 μm, optionally at least 400 μm. In an embodiment the attachment substrate 51 has a thickness of at most 1,000 μm, optionally at most 800 μm. In an embodiment the attachment substrate 51 has the thickness of at most 600 μm, optionally at most 400 μm. In an embodiment the attachment substrate 51 has a thickness of about 400 μm. In an embodiment the attachment substrate 51 has a thickness that is similar to the thickness of the supporting substrate 41.

The attachment substrate 51 is connected to the supporting substrate 41 and the membrane layer 55 such that they do not move relative to each other. In an embodiment the attachment substrate 51 is attached directly to a layer of the stack that at least partially forms the membrane of the membrane assembly 80. For example, in an embodiment the attachment substrate 51 is attached directly to the membrane layer 45 or to the upper capping film 46. However, in an alternative embodiment the stack 40 comprises an adhesion layer 47 (shown in FIG. 8). The adhesion layer 47 is between the membrane layer 45 and the attachment substrate 51. The attachment substrate 51 is attached to the adhesion layer 47.

In an embodiment the method comprises bonding the attachment substrate 51 directly or indirectly to the membrane layer 45 so as to provide the stack 40 comprising the membrane layer 45 between the supporting substrate 41 and the attachment substrate 51. In an embodiment the attachment substrate 51 is bonded directly to the membrane layer 45. In an alternative embodiment, the attachment substrate 51 is bonded indirectly to the membrane layer 45. For example, the attachment substrate 51 can be bonded indirectly to the membrane layer 45 via an intermediate layer such as an upper capping film 46, an adhesion layer 47 or another layer. In an embodiment the supporting substrate 41 is bonded to the attachment substrate 51 or to an intermediate capping film by using a wafer-bonding technique. The method of attaching/bonding the attachment substrate 51 to the rest of the stack 40 is not particularly limited. Any method of wafer-bonding known from the semiconductor industry, for example, may be used to attach the attachment substrate 51 to form the stack 40.

In an embodiment the supporting substrate 41 and/or the attachment substrate 51 is polished. The stack 40 has a top side and a bottom side. The top side is depicted at the top of the stack 40 in the Figures. The bottom side is depicted at the bottom of the stack 40 in the Figures. In an embodiment the supporting substrate 41 is polished at both the top side and the bottom side. However, this is not necessarily the case. In an embodiment the supporting substrate 41 is polished on only one of the top side and the bottom side. In an embodiment the supporting substrate 41 is thinned by grinding and or polishing or other thinning methods.

Figure 9:
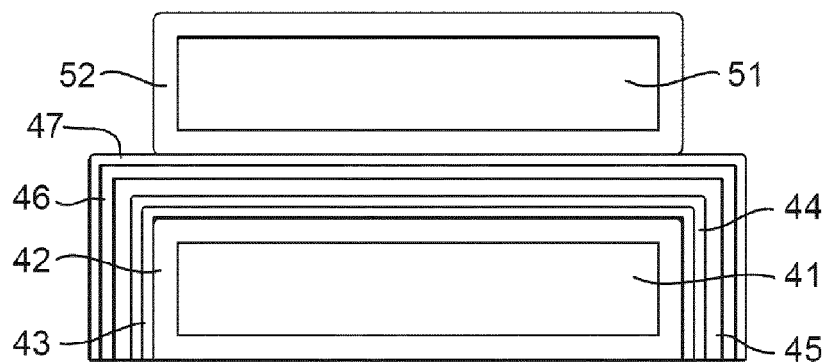

As depicted in FIG. 9, in an embodiment the method for manufacturing the membrane assembly 80 comprises removing the membrane layer 45 from the bottom side of the stack 40. In an embodiment the step of removing the membrane layer 45 from the bottom side of the stack 40 further comprises removing the lower sacrificial layer 43, the lower capping film 44, the upper capping film 46 and/or the adhesion layer 47 from the bottom side of the stack 40. Of course, if one or more of these layers is not provided at all or is not provided to the bottom side of the stack 40, then the step of removing the layer from the bottom side of the stack 40 is not necessary.

In an embodiment the step of removing the membrane layer 45 from the bottom side of the stack 40 is performed by an etching process, for example a dry etching process. In an embodiment the dry etching process comprises exposing the membrane layer 45 to a bombardment of ions that dislodge portions of the membrane layer 45 from the exposed surface. In an embodiment the ions are from a plasma such as a fluorocarbon, e.g. tetrafluoromethane ($CF_4$). As depicted in FIG. 9, the dry etching process stops when the oxidized layer 42 of the supporting substrate 41 at the bottom side of the stack 40 has been reached. If there is no oxidized layer 42 at the bottom side of the stack 40, then the dry etching process stops when the supporting substrate 41 has been reached at the bottom side of the stack 40.

Figure 10:
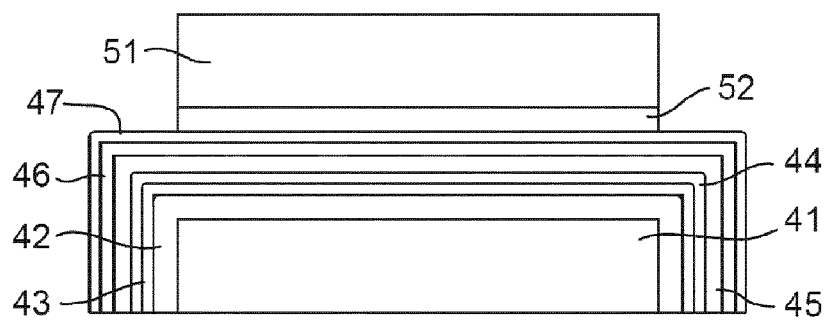

As depicted in FIG. 10, in an embodiment the method for manufacturing the membrane assembly 80 comprises removing the oxidized layer 42 from the bottom side of the stack 40. In an embodiment the oxidized layer 42 is removed using a wet etching process. For example, in an embodiment the etchant may be a wet etchant such as buffered oxide etch.

The etching process is stopped when the non-oxidized layer of the supporting substrate 41 is exposed at the bottom side of the stack 40.

Figure 15:
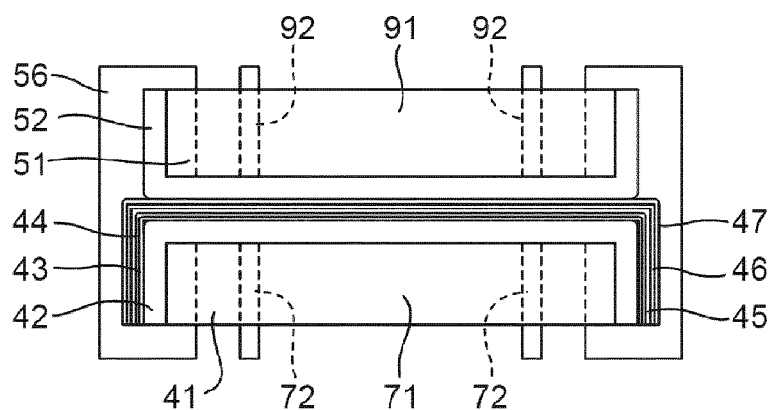

As depicted in FIG. 15, in an embodiment the supporting substrate 41 comprises an inner region 71 and a first border region 72. The border region 72 is around the inner region 71. The inner region 71 and the border region 72 are in the plane of the supporting substrate 41. In an embodiment the border region 72 surrounds the inner region 71 in the plane of the supporting substrate 41.

As depicted in FIG. 16, in an embodiment the method for manufacturing the membrane assembly 80 comprises a step of processing the stack 40, including selectively removing the inner region 71 of the supporting substrate 41, to form the membrane assembly 80. For example, the selective removal may comprise etching the supporting substrate 41. Part of the supporting substrate 41 forms a support 81 of the membrane assembly 80 (shown in FIG. 19). The support 81 holds the membrane of the membrane assembly 80. The support 81 is formed at least partly by the supporting substrate 41. The support 81 may be called a membrane assembly carrier. The support 81 is formed at least partially from the border region 72 of the supporting substrate 41.

Figure 11:
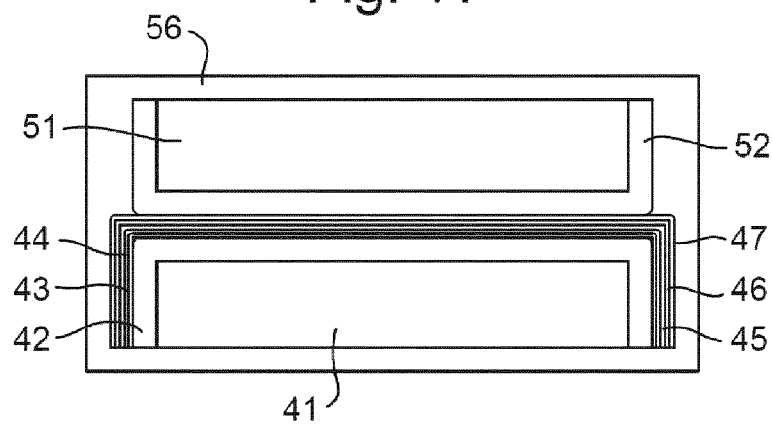

As depicted in FIG. 11, in an embodiment the step of selectively removing the inner region 71 of the supporting substrate 41 comprises forming an etch mask layer 56 at least at the bottom surface of the stack 40. In an embodiment the etch mask layer 56 is applied to both the top and bottom of the stack 40. In an embodiment the etch mask layer 56 corresponds to the border region 72 of the supporting substrate 41. In an embodiment the step of selectively removing the inner region 71 of the supporting substrate 41 comprises anisotropically etching the inner region 71 of the supporting substrate 41.

The etch mask layer 56 is used as an etch barrier, for the process of etching the supporting substrate 41 from the bottom side of the stack 40. In an embodiment, the etch mask layer 56 is provided by initially covering both the top surface and the bottom surface of the stack 40 with the etch mask layer 56.

In an embodiment the etch mask layer 56 comprises amorphous silicon nitride (e.g., a-$Si_3N_4$ or SiN). The etch mask layer 56 is resistant to the means used to selectively remove the inner region 71 of the supporting substrate 41, for example to the etch solution if done via wet-etching.

Figure 12:
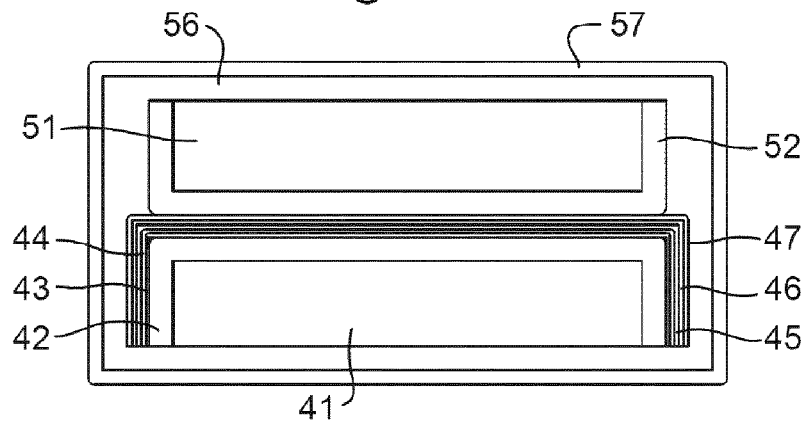

In an embodiment the method comprises selectively removing the etch mask layer 56. As depicted in FIG. 12, in an embodiment the step of selectively removing the etch mask layer 56 comprises applying a photo resist layer 57 to the top side and bottom side of the stack 40. In an embodiment the photo resist layer 57 has a thickness of about 3 µm. In an embodiment the photo resist layer 57 is applied by a spray coating method. The photo resist layer 57 is configured to protect the stack 40 from the etching process used to selectively remove the etch mask layer 56.

Figure 13:
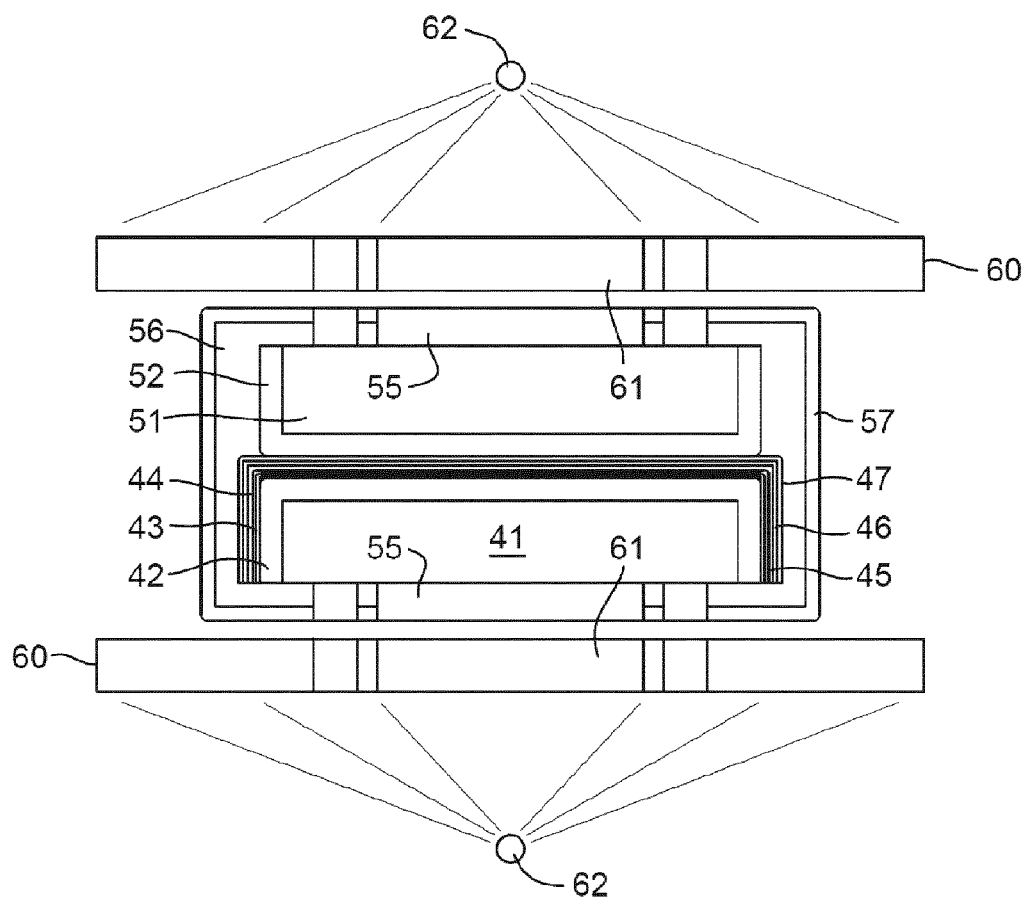

As depicted in FIG. 13, in an embodiment the step of selectively removing the etch mask layer 56 comprises exposing selected regions (e.g. corresponding to the inner region 71 of the supporting substrate 41) of the photo resist layer 57. This exposure process is configured to define the membrane assembly areas. In an embodiment, multiple membrane assembly areas may be defined for a single supporting substrate. A single supporting substrate 41 can be used to form multiple membrane assemblies 80.

As depicted in FIG. 13, in an embodiment an exposure mask 60 is provided so as to pattern the light eradiated onto the photo resist layer 57. The exposure mask 60 comprises mask openings 61. The mask openings 61 define regions or areas that will correspond to the inner region 71 of the supporting substrate 41. The inner region 71 of the supporting substrate 41 corresponds to the region in the membrane assembly 80 that has a membrane without support 81 through which UV radiation can be transmitted.

As depicted in FIG. 13, a radiation source 62 is provided. The radiation source 62 irradiates the photo resist layer 57 through the mask openings 61 of the exposure mask 60. Exposed regions 55 of the photo resist layer 57 are formed as shown in FIG. 13.

As depicted in FIG. 13, in an embodiment the method comprises removing the exposed regions 55 of the photo resist layer 57. In an embodiment the exposed regions 55 are dissolved. It is to be noted that in the process of selectively removing the etch mask layer 56, either a positive mask or a negative mask may be used.

As depicted in FIG. 13, in an embodiment the method comprises etching the etch mask layer 56 in regions corresponding to where the exposed regions 55 were removed (e.g. dissolved). When the exposed regions are removed, an etch opening is created in its place. The etch mask layer 56 is removed in regions corresponding to the etch openings. The etch opening extends into the region where the etch mask layer 56 is removed from the stack 40. In an embodiment the method comprises dry etching the etch mask layer 56.

Figure 14:
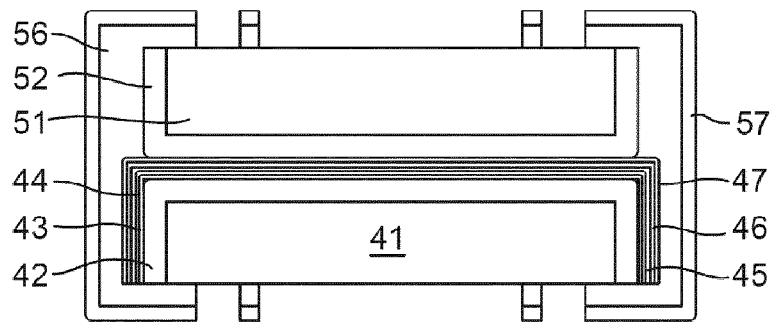

As described above, in an embodiment the stack 40 is structured using a lithographic process and a dry etch process. Alternatively, in an embodiment an alternative structuring method is used to structure the surfaces of the stack 40. FIG. 14 depicts the stack 40 following the development and etching of the exposed areas.

As depicted in FIG. 15, in an embodiment the method for manufacturing the membrane assembly 80 comprises removing the photo resist layer 57. After the step of selectively removing the etch mask layer 56 has been completed, the photo resist layer 57 is no longer required. The photo resist layer 57 can be removed so that it does not interfere with the subsequent process steps.

Figure 17:
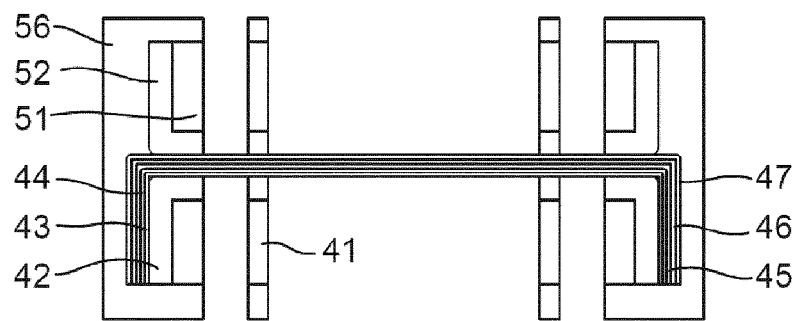
Figure 18:
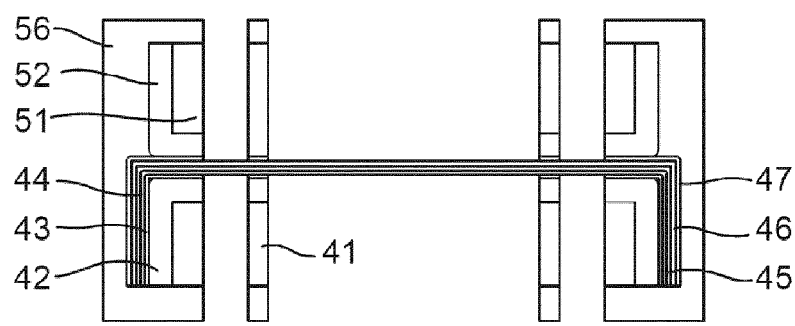

FIGS. 16 to 18 schematically depict stages of a method for manufacturing a membrane assembly 80 for EUV lithography according to an embodiment of the invention. In an embodiment a wet etchant such as KOH is used to selectively remove the inner region 71 of the supporting substrate 41. Hence, in an embodiment the etch mask layer 56 is chemically resistant to the wet etchant. Other wet etchants such as TMAH (tetramethylammonium hydroxide) and EDP (an aqueous solution of ethylene diamine and pyrocatechol) can be used.

FIG. 16 shows the stack 40 after the step of selectively removing the inner region 71 of the supporting substrate 41. The oxidized layer 42 protects the membrane from the wet etching step.

The step of selectively removing the inner region 71 of the supporting substrate 41 can result in damage to the membrane assembly 80 during its manufacture. At this stage of the manufacturing method, the stack 40 is particularly thin. When the inner region 71 of the supporting substrate 41 is selectively removed, the stack 40 comprises a mixture of extremely thin portions (where the inner region 71 has been removed) and thin portions (corresponding to the support 81 where the border region 72 of the supporting substrate 41 has not been removed). This can result in mechanical stresses on the stack 40. It is possible for the stack 40 to break, or undesirably be damaged in other ways.

By providing that the stack 40 comprises the attachment substrate 51, it is not necessary to provide the stack 40 with other mechanical protection when the wet etchant is used to selectively remove the inner region 71 of the supporting substrate 41. By providing the attachment substrate 51, the attachment substrate 51 mechanically protects the stack 40 during the step of selectively removing the inner region 71 of the supporting substrate 41.

As a comparative example, a mechanical protection material can be used to provide mechanical protection to the stack 40 (for the entire stack surface or locally) during the step of etching the supporting substrate 41. If such a mechanical protection material is added as a layer to the stack 40, then the layer of the mechanical protection material must be removed from the stack 40 at a later stage. A removing substance such as an oxidative substance can be used to remove the mechanical protection material. However, if a removal substance is used to remove the mechanical protection material, then the membrane of the membrane assembly 80 can be damaged to be less uniform. For example, oxidation of the upper capping film 46 or the membrane layer 45 can add oxygen atoms to the membrane such that the membrane becomes thicker in some places. This oxidation will increase the absorption of EUV radiation.

By providing the attachment substrate 51, the membrane of the membrane assembly 80 is expected to be more uniform and have a more controlled shape. This is because no step of using a removal substance to remove a mechanical protection material is required. This is expected to improve the imaging properties of the membrane assembly 80, for example reducing the level of absorption of EUV radiation, and to make the membrane assembly more uniform.

In an embodiment the etchant used to etch the inner region 71 of the supporting substrate 41 is KOH. The drawback of providing a layer for mechanical protection during the KOH etching process is that it is hard to remove. With the removal of the layer for mechanical protection, using a removal substance such as an oxidative substance, the functionality of the membrane assembly 80 is degraded. In an embodiment, the layer for mechanical protection is not required in the processing. An embodiment of the invention is expected to achieve a circumvention of the influence of the oxidative substance on the membrane assembly 80. This is because a mechanical protection layer is no longer required. This leads to a better quality, more reproducible and more uniform membrane assembly 80, compared to membrane assemblies manufactured using known processes.

As depicted in FIG. 17, any layer such as the oxidized layer 42 present adjacent to the membrane is removed by any suitable method. As a result, the membrane is freed.

As depicted in FIG. 17, in an embodiment the stack 40 comprises a lower sacrificial layer 43 and/or an adhesion layer 47. The lower sacrificial layer 43 and/or the adhesion layer 47 protects the membrane layer 45 and any capping films during the selective removal of any layer such as the oxidized layer 42 of the supporting substrate 41 present at the bottom of the membrane.

FIG. 18 schematically depicts the stack 40 after the step of removing, e.g. by etching, the oxidized layer 42, the lower sacrificial layer 43, the oxidized layer 52 and the adhesion layer 47.

In an embodiment the method for manufacturing the membrane assembly 80 comprises selectively removing the inner region 71 of the supporting substrate 41. As a result the membrane assembly 80 comprises a membrane formed from the membrane layer 45 and a support 81 holding the membrane. The support 81 is formed from the border region 72 of the supporting substrate 41.

The support 81 improves the mechanical stability of the membrane of the membrane assembly 80. This makes it easier to package and transport the membrane assembly 80 without the membrane assembly 80 being damaged. This also makes it easier for the membrane assembly 80 to be attached to the patterning device MA by a frame without the membrane assembly 80 being damaged.

In an embodiment the support 81 of the membrane assembly 80 is configured to be connected to the frame that connects the membrane assembly 80 to the patterning device MA. The frame does not need to be attached directly to the membrane of the membrane assembly 80. The frame can be attached to the support 81 of the membrane assembly 80. This reduces the possibility of the membrane of the membrane assembly 80 being damaged during the process of fitting the membrane assembly 80 to the patterning device MA.

As depicted in FIG. 15, in an embodiment the attachment substrate 51 comprises a cover region 91 and a second border region 92. In an embodiment the step of processing the stack 40 includes removing at least the cover region 91 of the attachment substrate 51.

As depicted in the transition from FIG. 15 to FIG. 16, in an embodiment the step of processing the stack 40 includes selectively removing the cover region 91 of the attachment substrate 51, such that the second border region 92 of the attachment substrate 51 remains in place. As depicted in FIG. 15, in an embodiment the cover region 91 of the attachment substrate 51 substantially corresponds to the inner region 71 of the supporting substrate region 41 when viewed in plan view. Plan view means viewing the stack 40 in a direction normal to the plane of the supporting substrate 41.

Figure 19:
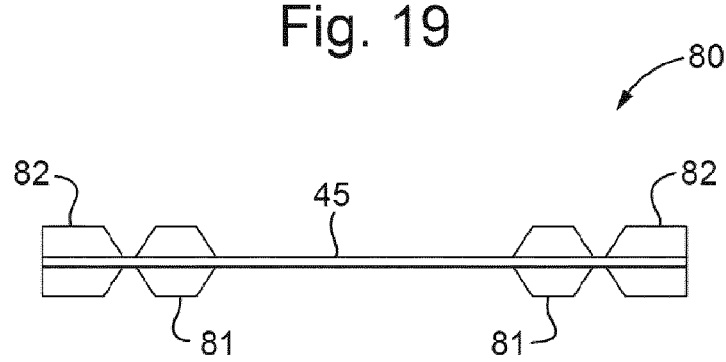

However, it is not necessary for the cover region 91 of the attachment substrate 51 to correspond in shape to the inner region 71 of the supporting substrate 41. The shape/pattern of the cover region 91 is not particularly limited. As shown in FIG. 18 and FIG. 19, the second border region 92 that remains after the step of selectively removing the cover region 91 forms part of the support 81. The second border region 92 that forms part of the support 81 of the membrane assembly 80 improves the mechanical stability of the support 81.

In an embodiment the selective removal of the inner region 71 of the supporting substrate 41 and the removal of at least the cover region 91 of the attachment substrate 51 are performed simultaneously. The inner region 71 and the cover region 91 can be removed in the same processing step, for example using the same etchant. Accordingly, it is not necessary to provide an additional process step to remove the attachment substrate 51 that provides mechanical stability to the stack 40 during the step of selectively removing the inner region 71 of the supporting substrate 41. An embodiment of the invention is expected to achieve a reduction in the time it takes to manufacture the membrane assembly 80.

In an embodiment the selective removal of the inner region 71 of the supporting substrate is performed using an etchant. In an embodiment the removal of at least the cover region 91 of the attachment substrate 51 is performed using the same etchant. Accordingly, it is not necessary to provide a different etchant to remove the inner region 71 of the supporting substrate 41 and the attachment substrate 51. Accordingly, an embodiment of the invention is expected to achieve a reduction in the cost of manufacturing a membrane assembly 80.

In an embodiment the supporting substrate 41 has a chemical composition and the attachment substrate 51 has the same chemical composition. Accordingly, the same etchant can be used to remove parts of the supporting substrate 41 and the attachment substrate 51.

In an embodiment an average thickness of the attachment substrate 51 is within 20% (optionally within 10%) of an average thickness of the supporting substrate 41. In an embodiment the average thicknesses of the attachment substrate 51 and the supporting substrate 41 are substantially the same. However, it is not necessary for the thicknesses to be the same. If the thicknesses are the same, then it will take approximately the same time to etch fully through the attachment substrate 51 as the supporting substrate 41. However, this is not necessary because a layer such as the oxidized layers 42, 52 can be provided to stop the etching process once the full thickness of the attachment substrate 51 or supporting substrate 41 has been etched.

By providing that the cover region 91 of the attachment substrate 51 is selectively removed (leaving the second border region 92), the thickness of the attachment substrate 51 contributes to the overall thickness of the support 81 in the membrane assembly 80. This is shown in FIG. 19. Accordingly, the thicknesses of the supporting substrate 41 and the attachment substrate 51 can be reduced, without reducing the mechanical stability of the support 81 or the membrane assembly 80.

Pre-tension is generated in the membrane stack (which becomes the membrane of the membrane assembly 80) during the manufacturing process so that the membrane of the membrane assembly 80 will be straight and flat during use. If no pre-tension is applied, then the membrane may be undesirably flappy or wrinkled (wrinkling leading also to a non-uniform membrane thickness). A loose or a non-uniform thickness membrane can have poorer imaging properties. However, if the pre-tension is too high, then the membrane can be brittle and more susceptible to breaking. Accordingly, it is desirable to control the pre-tension in the manufacturing process of the stack 40 to be within a target range.

In an embodiment the second border region 92 contributes to maintaining the pre-tension applied to the membrane of the membrane assembly 80.

In an embodiment a sum of an average thickness of the supporting substrate 41 and an average thickness of the attachment substrate 51 is at least 700 µm. By providing that the sum of the average thicknesses is at least 700 µm, the support 81 has good stability, providing a relatively robust membrane assembly 80 that maintains any pre-tension.

Use of a thin substrate (400 µm) may cause the substrate to bend/curve due to the stress introduced, leading to possible problems in the wafer-bonding process. To circumvent such bending, in an embodiment the supporting substrate 41 is chosen to be a wafer having a standard wafer thickness such as 720 µm. The stack of layers is deposited on the supporting substrate 41 wafer-bonding is performed using a thinner (such as 400 µm thick) attachment substrate 51. After the wafer-bonding step, the supporting substrate 41 can also be thinned down to 400 µm using a standard wafer-thinning process (such as grinding, etching, or other standard wafer thinning methods). Further processing steps of the bonded substrates 41 and 51 may be the same as further described herein.

In an embodiment there is provided a method for manufacturing a membrane assembly for a lithographic apparatus, the method comprising providing a supporting substrate 41 having an average thickness of at least 600 µm, preferably at least 700 µm, with a membrane layer; wafer bonding an attachment substrate 51 having an average thickness of less than 500 µm to the supporting substrate 41 provided with the membrane layer to form a stack, wherein the membrane layer is encapsulated between the supporting substrate 41 and the attachment substrate 51; and subsequently thinning the supporting substrate 41 bonded to the attachment substrate 51 to an average thickness of the supporting substrate 41 to be less than 500 µm.

Preferably the thickness of the supporting substrate 41 and the thickness of the attachment substrate 51 are substantially equal in order to form a substantially symmetrical stack, since in such way it will provide a shorter and more efficient substrate-etching process in subsequent processing steps. By "substantially equal" herein is meant that the thickness of the supporting substrate 41 and the thickness of the attachment substrate 51 may vary slightly, for example the average thickness of the supporting substrate 41 may be up to 20% larger, preferably up to 10% larger, and more preferably up to 5% larger than the average thickness of the attachment substrate 51. Reciprocally, the average thickness of the supporting substrate 41 may also be shorter than the average thickness of the attachment substrate 51.

In an embodiment the average thickness of the supporting substrate 41 is at most 500 µm, optionally 400 µm. In an embodiment an average thickness of the attachment substrate 51 is at most 500 µm, optionally 400 µm. By providing two substrates each having a thickness of at most 500 µm (e.g. 400 µm), the time it takes to etch through the substrate is reduced. Accordingly, the time period required for the process of selectively removing the inner region 71 of the supporting substrate 41 (and the cover region 91 of the attachment substrate 51) is reduced. An embodiment of the invention is expected to achieve a reduction in the time it takes to manufacture the membrane assembly 80.

However, it is not necessary for the second border region 92 of the attachment substrate 51 to form part of the support 81 in the membrane assembly 80. In an embodiment the second border region 92 of the attachment substrate 51 is removed together with the cover region 91.

As mentioned above, in an embodiment the stack comprises a lower capping film 44 between the supporting substrate 41 and the membrane layer 45. The lower capping film 44 forms part of the membrane of the membrane assembly 80. Additionally, in an embodiment the stack 40 comprises an upper capping film 46 between the membrane layer 45 and the attachment substrate 51, wherein the upper capping film 46 forms part of the membrane of the membrane assembly 80. However, this is not necessarily the case.

In an embodiment the stack 40 does not comprise the lower capping film 44 or the upper capping film 46. As an alternative, the lower capping film 44 and/or the upper capping film 46 can be applied to the membrane layer 45 at the end of the process flow. This allows the combination of a capping of the membrane and adds the functionality of an emissive layer at one of the last process steps.

In particular, in an embodiment the method comprises applying a lower (i.e. bottom) capping film 44 to a surface of the membrane layer 45 that is exposed after selective removal of the inner region 71 of the supporting substrate 41, such that the lower capping film 44 forms part of the membrane of the membrane assembly 80. Similarly, in an embodiment the method comprises applying an upper (i.e. top) capping film 46 to a surface of the membrane layer 45 that is exposed after removal of at least the cover region 91 of the attachment substrate 51, such that the upper capping film 46 forms part of the membrane of the membrane assembly 80. In an embodiment the membrane (or membrane stack) comprises three layers, namely the membrane layer 45, the lower capping film 44 and the upper capping film 46. However, it is not necessary for the membrane to comprise three layers. For example, in an embodiment the membrane comprises only one layer, namely the membrane layer 45. In an embodiment the membrane comprises two, four or five layers (i.e. is a membrane stack).

Figure 20:
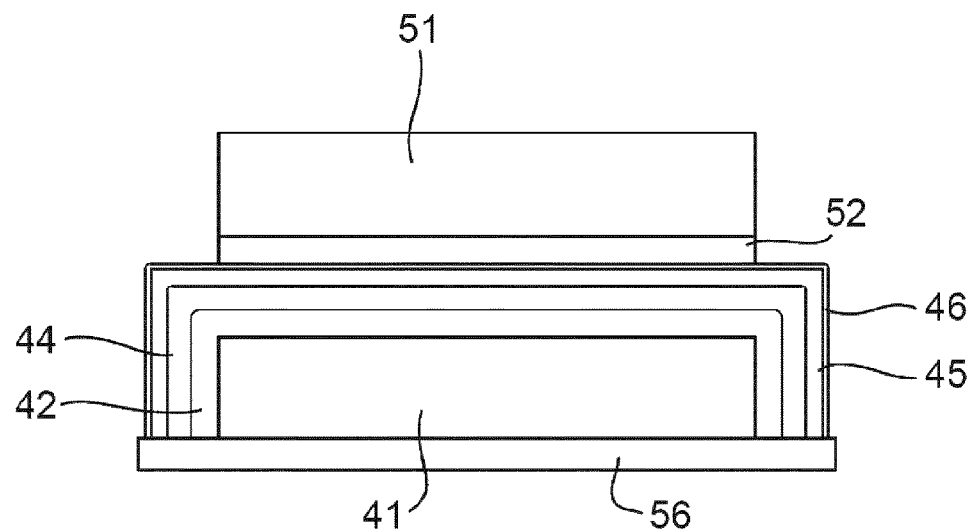
FIGS. 20 to 29 schematically depict stages of an alternative method for manufacturing a pellicle according to an embodiment of the invention.

FIGS. 20 to 29 depict process steps of an alternative method of manufacturing the membrane assembly 80. FIG. 20 follows on from the step shown in FIG. 11. As depicted in FIG. 20, in an embodiment the etch mask layer 56 is removed from the top side of the stack 40. Accordingly, the etch mask layer 56 does not protect the attachment substrate 51 during the step of selectively removing the inner region 71 of the supporting substrate 41.

Figure 21:
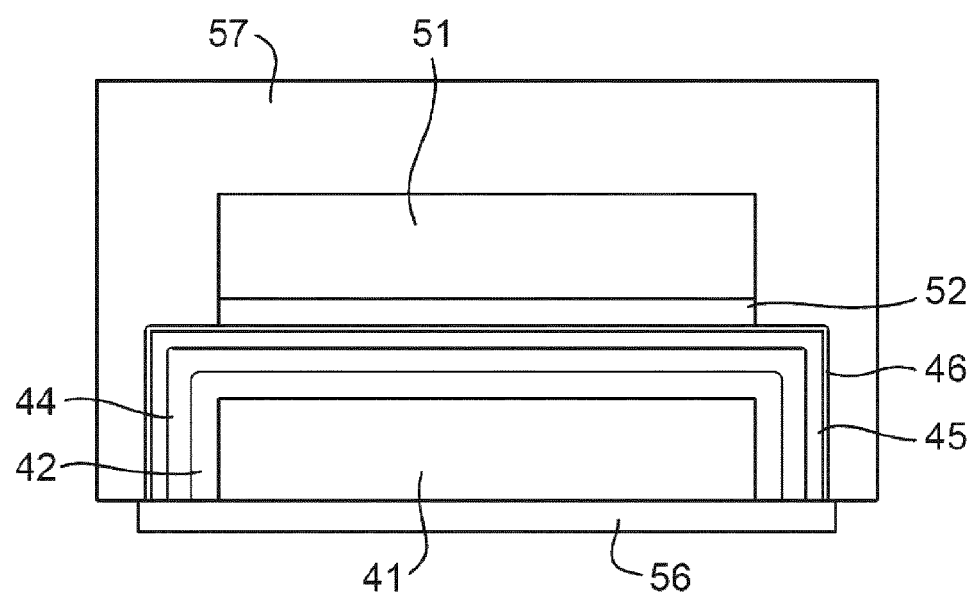

As depicted in FIG. 21, in an embodiment the method comprises applying the photo resist layer 57 to the top side of the stack 40 but not to the bottom side of the stack 40. The top side of the stack 40 corresponds to where the attachment substrate 51 is positioned. The bottom side of the stack 40 corresponds to where the supporting substrate 41 is positioned.

Figure 22:
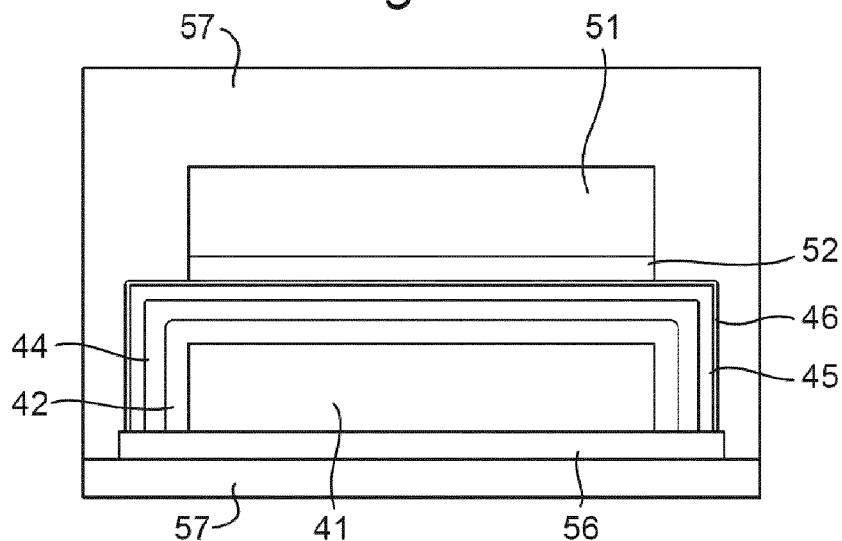

As depicted in FIG. 22, the photo resist layer 57 is subsequently applied to the bottom side of the stack 40. Accordingly, in an embodiment the step of applying the photo resist layer 57 is performed as a two-stage process. In one stage the photo resist layer is applied to sections of the stack 40 that are not covered by the etch mask layer 56. In a subsequent stage the photo resist layer 57 is applied to the surface of the etch mask layer 56.

Figure 23:
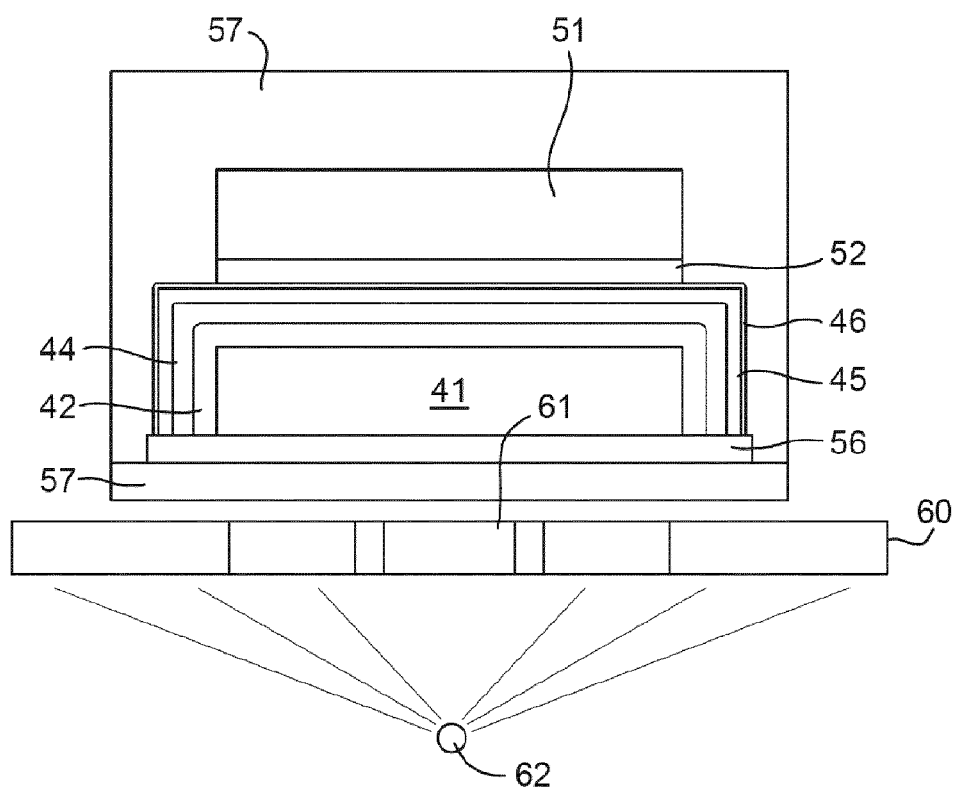

The step shown in FIG. 23 corresponds to the step shown in FIG. 13. During the exposure step, a foil mask can be used to define the area that will become the membrane of the membrane assembly 80. This step will not be described in further detail because of its similarity to the step described in related to FIG. 13.

Figure 24:
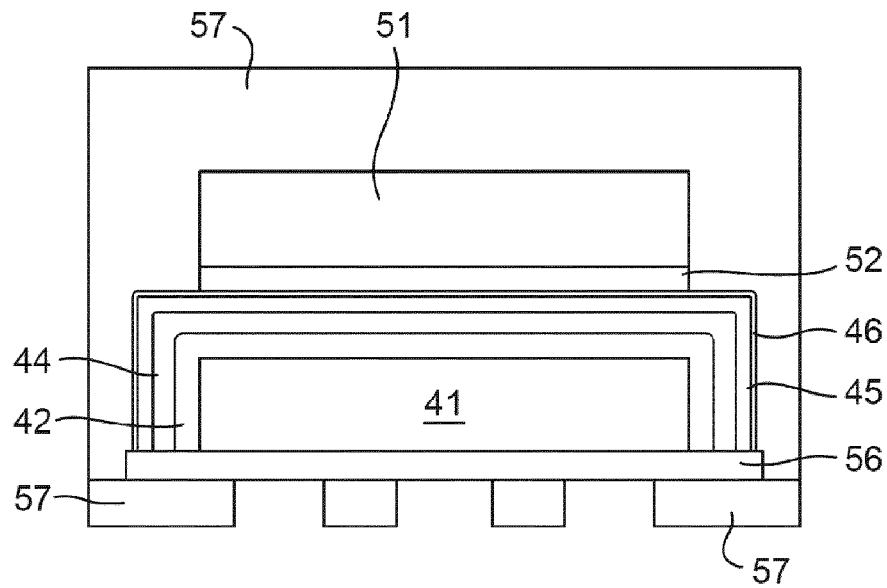
Figure 25:
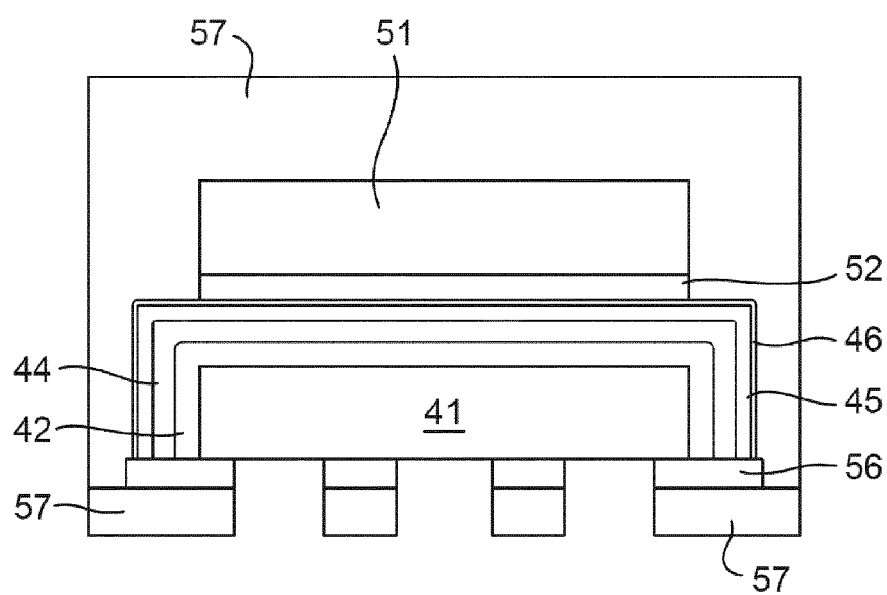

FIGS. 24 and 25 correspond to the stage shown in FIG. 14. In particular, exposed areas are developed as shown in FIG. 24 and then the etch mask layer 56 is etched as shown in FIG. 25. These processes will not be described in further detail here because of their similarity to the processes described in conjunction with FIG. 13 and FIG. 14 above.

Figure 26:
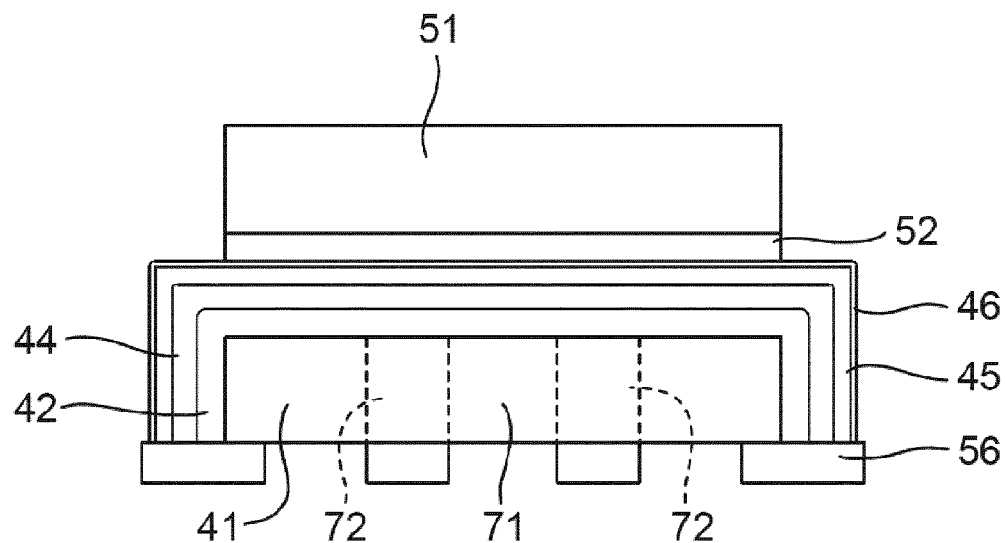

As depicted in FIG. 26, the photo resist layer 57 is then removed, as described above in conjunction with FIG. 15. The photo resist layer 57 was applied only to the top side of the stack 40 such that it is only necessary to remove the photo resist layer 57 from the top side of the stack 40.

Figure 27:
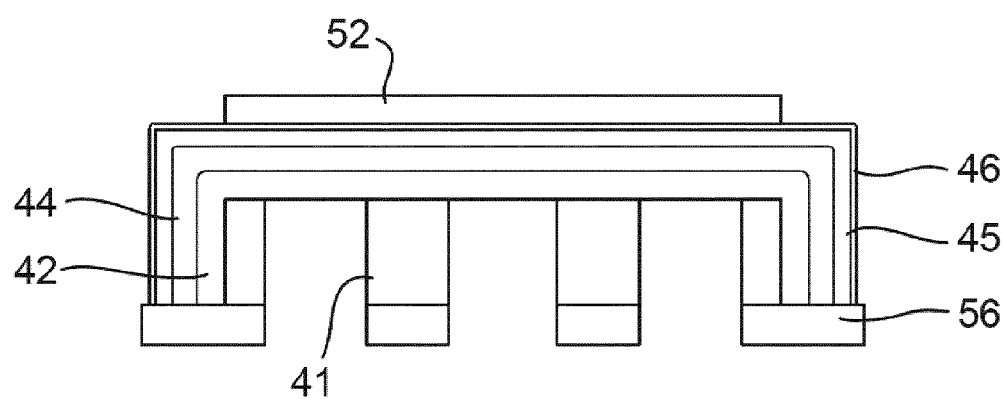

FIG. 27 shows the stack 40 after the process of selectively removing the inner region 71 of the supporting substrate 41. As shown in FIG. 27, the whole of the non-oxidized layer of the attachment substrate 51 has been removed during the etching step. In particular, both the cover region 91 and the second border region 92 of the attachment substrate 51 have been removed. Accordingly, the attachment substrate 51 does not form part of the support 81 of the membrane assembly. In an embodiment the average thickness of the supporting substrate 41 is at least 700 μm, such that it is not necessary for the attachment substrate 51 to form part of the support 81. The supporting substrate 41 alone can provide sufficient mechanical strength to the support 81 of the membrane assembly 80.

Figure 28:
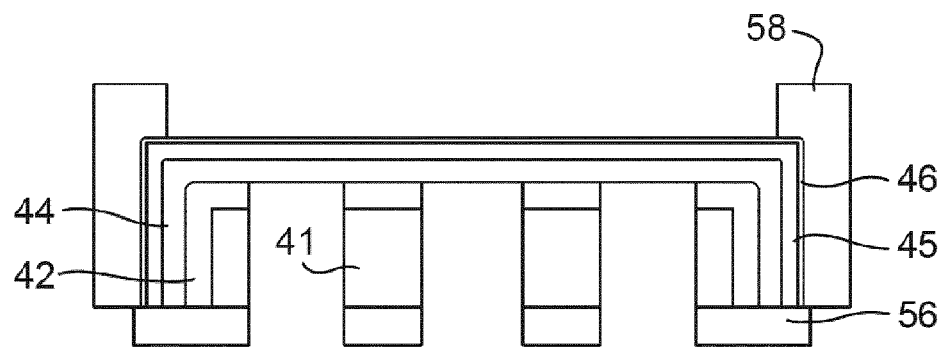

As depicted in FIG. 28, in an embodiment the method comprises applying photo resist 58 to the stack 40. The photo resist 58 is applied to add stiffness to the stack 40. This is helpful during the step of selectively removing the oxidized layers 42, 52. The step of applying the photo resist 58 is equally applicable to any embodiment of the invention.

Figure 29:
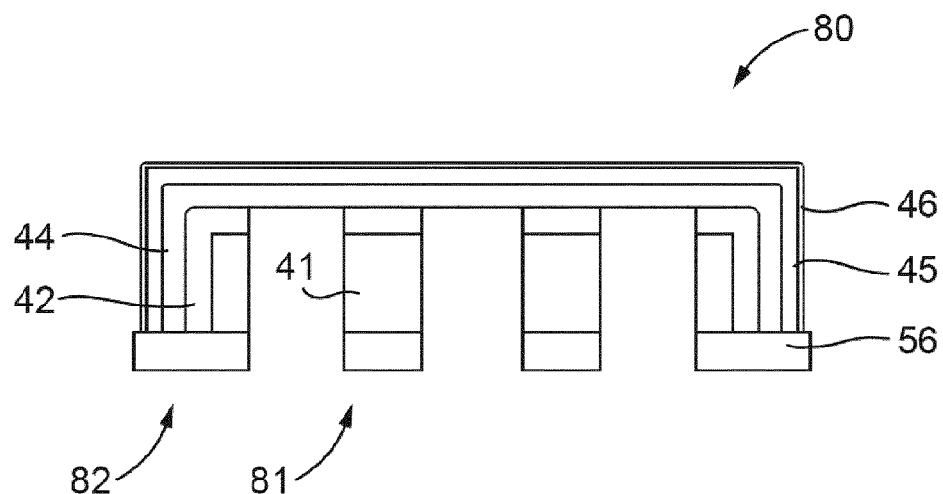

As depicted in FIG. 29, in an embodiment the method comprises removing the photo resist 58 from the stack 40, so as to produce the membrane assembly 80.

FIG. 19 schematically depicts a completed membrane assembly 80. The membrane assembly 80 comprises the membrane layer 45, which forms at least part of the membrane. The membrane assembly comprises the support 81 that provides mechanical support to the membrane. In an embodiment the membrane assembly 80 further comprises an edge section 82. In an embodiment the method comprises breaking the membrane layer 45 between the support 81 and the edge section 82 so as to separate the support 81 with the membrane from the edge section 82.

Figure 34:
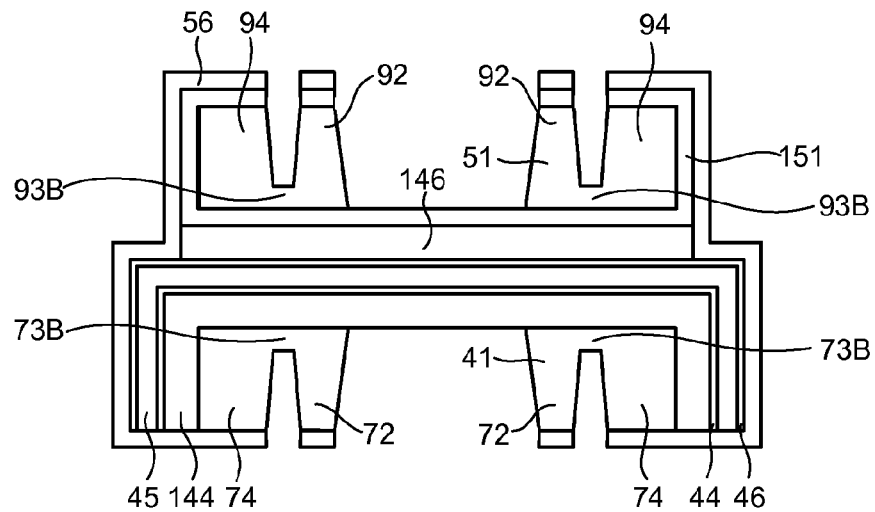

In an embodiment the membrane assembly 80 is applied as a pellicle or as part of a dynamic gas lock. Alternatively, the membrane assembly 80 can be applied in other filtration areas such as identification, or for beam splitters. The membrane assembly 80 shown in FIG. 34 is thereby produced.

FIGS. 30-45 schematically depict stages of a method of manufacturing the membrane assembly according to an alternative embodiment. In embodiments of this type, prior to the selective removal of the inner region 71 of the supporting substrate 41, the supporting substrate 41 further comprises a first bridge region 73 around the first border region 72 and a first edge region 74 around the first bridge region 73 (see for example FIG. 33). The processing of the stack 40 includes selectively removing a first portion 73A of the first bridge region 73 to form a first bridge. The processing of the stack 40 further comprises separating the first edge region 74 from the membrane assembly 80 by cutting or breaking the first bridge. In an embodiment, prior to a removal of a cover region 91 of the attachment substrate 51, the attachment substrate 51 comprises the cover region 91, a second border region 92 around the cover region 91, a second bridge region 93 around the second border region 92, and a second edge region 94 around the second bridge region 93 (see for example FIG. 33). The processing of the stack includes selectively removing a first portion 93A of the second bridge region 93 to form a second bridge. The processing of the stack further comprises separating the second edge region 94 from the membrane assembly 80 by cutting or breaking the second bridge. In an embodiment, the cutting or breaking of the first bridge is performed simultaneously with the cutting or breaking of the second bridge.

Figure 30:
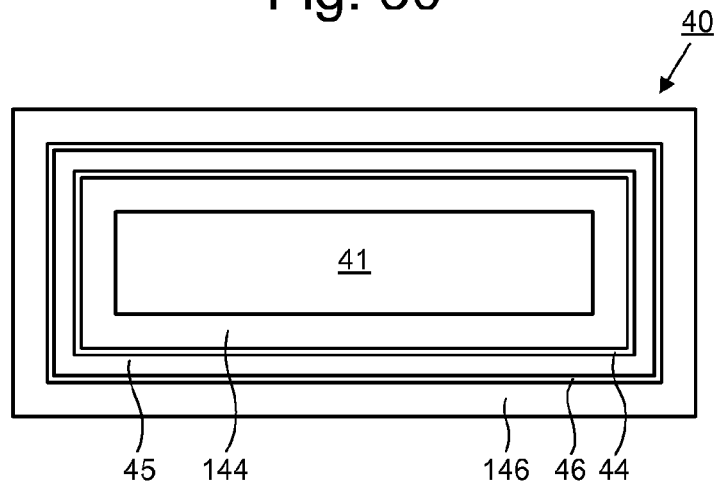

In an embodiment a stack 40 is formed, as shown in FIG. 30, starting from a supporting substrate 41. In contrast to the stack 40 shown in FIG. 7 and described above, the supporting substrate 41 is not shown as having an oxidized layer 42, but this layer may be provided if desired. For example, the lower etch barrier 144 discussed below may comprise such an oxidized layer. The stack 40 comprises a lower capping film 44, a membrane layer 45, and an upper capping film 46. The lower capping film 44, membrane layer 45, and upper capping film 46 may be configured in any of the ways described above with reference to any of the embodiments of FIG. 1-29. The stack 40 comprises a lower etch bather 144 and an upper etch bather 146. In an embodiment, the lower etch bather 144 may comprise or consist of either or both of the oxidized layer 42 and the sacrificial layer 43 described above with reference to the embodiments of FIG. 1-29. The lower etch barrier 144 may comprise other layers.

In an embodiment, the upper etch barrier 146 is provided above the membrane layer 45. Optionally the upper etch barrier 146 is above and in contact with the membrane layer 45 or, where provided, the upper capping film 46. In an embodiment, the lower etch barrier 144 is provided below the membrane layer 45. Optionally the lower etch barrier 144 is below and in contact with the membrane layer 45 or, where provided, the lower capping film 44. Where both the upper etch barrier 146 and the lower etch barrier 144 are provided, at least a portion of the upper etch barrier 146 and a portion of the lower etch barrier 144 that together sandwich a portion of the membrane layer 45 are removed during the processing of the membrane assembly 80 to release the membrane layer 45 and form the membrane. Where only one of the upper etch barrier 146 and the lower etch barrier 144 is provided, at least a portion of the provided upper etch barrier 146 or lower etch barrier 144 will be removed during the processing to release the membrane layer 45 and form the membrane.

In an embodiment the upper etch bather 146 and lower etch barrier 144 are each configured to apply substantially equal tensile or compressive forces to the membrane layer 45.

In an embodiment, at least 50% by thickness (optionally at least 80%, optionally at least 90%, optionally at least 95%, optionally at least 98%, optionally at least 99%) of the upper etch barrier 146 has the same chemical composition respectively as at least 50% (optionally at least 80%, optionally at least 90%, optionally at least 95%, optionally at least 98%, optionally at least 99%) by thickness of the lower etch barrier 144. In an embodiment, a thickness of the upper etch barrier 146 differs from a thickness of the lower etch barrier 144 layer by less than 50% (optionally less than 20%, optionally less than 10%, optionally less than 5%, optionally less than 2%, optionally less than 1%). The membrane layer 45 is thus supported symmetrically by the upper etch barrier 146 and lower etch barrier 144.

Supporting the at least one membrane layer 45 symmetrically ensures that the same or similar tensile or compressive forces are applied to each side of the membrane layer 45. Distortion of the membrane layer 45 due to unbalanced forces is reduced. Furthermore, where 80% or more of the lower etch barrier 144 and upper etch barrier 146 comprise tetraethylorthosilicate (TEOS), as described in the context of a specific example below, the forces applied will comprise much lower compressive forces, compared with alternative materials (such as thermal oxide), or may even comprise tensile forces. A lower compressive force or tensile force reduces wrinkles or fluffy textures in the membrane layer 45, which might otherwise occur after release of the membrane layer 45. Yield can therefore be increased.

In an embodiment, the upper etch barrier 146 comprises a plurality of layers of different composition. In an embodiment the thickest of the plurality of layers comprises tetraethylorthosilicate (TEOS) formed using LPCVD or PECVD. In an embodiment the lower etch barrier 144 comprises a plurality of layers of different composition. In an embodiment a thickest of the plurality of layers comprises tetraethylorthosilicate (TEOS) formed using LPCVD or PECVD.

In an embodiment the lower etch barrier 144 comprises in sequence a first lower etch barrier layer, a second lower etch barrier layer and a third lower etch barrier layer. The first lower etch barrier layer is closest to the supporting substrate 41. In an embodiment the first lower etch barrier layer is thinner than the second and third lower etch barrier layers and is configured to act as an etch stop layer against a removal process (e.g. KOH or TMAH, tetramethylammonium hydroxide, etch) for removing regions of the supporting substrate 41. In an embodiment the first lower etch barrier layer comprises silicon nitride. The layer of silicon nitride may be formed for example using LPCVD at a temperature in the range of 750 to 900° C., for example at 850° C. Alternatively, the layer of silicon nitride may be formed using PECVD. In an embodiment the layer of silicon nitride has a thickness of approximately 2-10 nm. In an embodiment the second lower etch barrier layer comprises a tetraethylorthosilicate (TEOS) layer. The TEOS layer may be formed for example using LPCVD at 725° C., or PECVD. In an embodiment the TEOS layer has a thickness of approximately 500 nm. In an embodiment the third lower etch barrier layer is a sacrificial layer. In an embodiment, the composition of the third lower etch barrier layer is chosen so that a selective etch can remove the third lower etch barrier layer without removing a lower capping film 44 of the membrane layer 45. In an embodiment the third lower etch barrier layer comprises an amorphous silicon layer. In an embodiment the amorphous silicon layer is formed using LPCVD at a temperature in the range of about 500 to 620° C., for example at about 560° C. Alternatively, the amorphous silicon layer is formed using PECVD. In an embodiment, the third lower etch barrier layer is approximately 30 nm thick.

In an embodiment the upper etch barrier 146 comprises a first upper etch barrier layer and a second upper etch barrier layer. The first upper etch barrier layer is closest to the membrane layer 45. In an embodiment the first upper etch barrier layer is a sacrificial layer. In an embodiment, the composition of the first upper etch barrier layer is chosen so that a selective etch can remove the first upper etch barrier layer without removing the upper capping layer 46. In an embodiment the first upper etch barrier layer comprises an amorphous silicon layer. In an embodiment the amorphous silicon layer is formed using LPCVD at a temperature in the range of about 500 to 620° C., for example at 560° C. Alternatively, the amorphous silicon layer is formed using PECVD. In an embodiment, the first upper etch barrier layer is approximately 30 nm thick. In an embodiment the second upper etch barrier layer, which is positioned on top of the first upper etch barrier layer, comprises TEOS. The TEOS may be formed for example using LPCVD at 725° C., or PECVD. In an embodiment the second upper etch barrier layer has a thickness of approximately 500 nm. Optionally a third upper etch barrier layer may be provided that has the same composition as the first lower etch barrier layer of the lower etch barrier 144 to make the upper etch barrier 146 completely symmetric with the lower etch barrier 144.

In a subsequent step, an attachment substrate 51 is added to the stack 40 as shown above. The attachment substrate 51 may be configured in any of the ways described above with reference to FIGS. 1-29. The attachment substrate 51 may be wafer bonded to the stack 40 of FIG. 30 to form the stack 40 of FIG. 31. An adhesion layer (not shown) may be provided. Any method of wafer-bonding known from the semiconductor industry, for example, may be used to attach the attachment substrate 51 to form the stack 40.

In an embodiment, an attachment substrate sacrificial layer 151 is provided around the attachment substrate 51. The attachment substrate sacrificial layer 151 may be an oxidized layer configured in the same or similar manner to the oxidized layer 52 shown in FIG. 8, or the attachment substrate sacrificial layer 151 may have a different composition.

Figure 31:
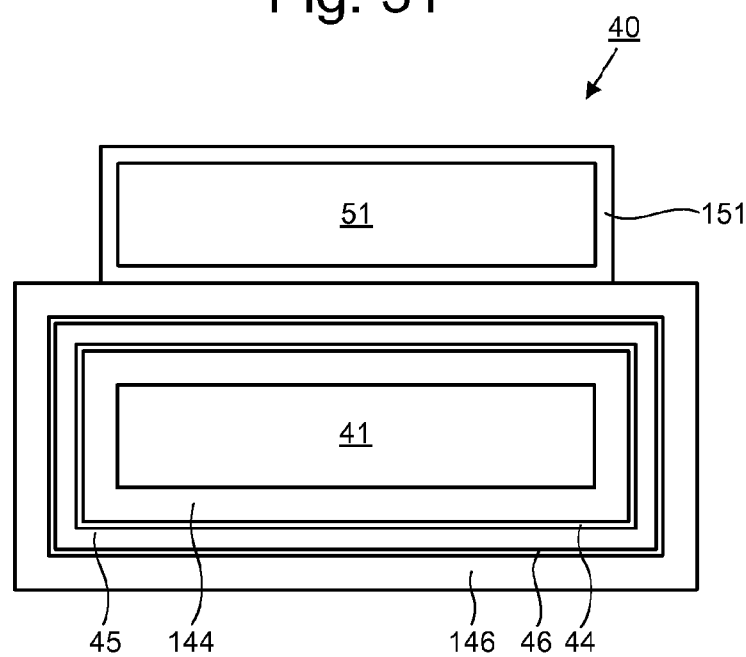

The stack 40 of FIG. 31 is processed, for example by polishing on the bottom side, to remove the upper etch barrier 146, upper capping film 46, membrane layer 45, lower capping film 44, and lower etch barrier 144. The stack 40 is then coated with an etch mask layer 56 to provide the stack 40 shown in FIG. 32.

The etch mask layer 56 is selectively removed to provide the stack 40 shown in FIG. 33. The selective removal may be performed using the processing described above with reference to FIGS. 13 and 14. Openings in the etch mask layer 56 expose regions of the supporting substrate 41 and attachment substrate 51 to be selectively removed. As indicated by dot-chain lines, the supporting substrate 41 comprises an inner region 71, a first border region 72 around the inner region 71 (e.g. surrounding the inner region 71), a first bridge region 73 around the first border region 72 (e.g. surrounding the first border region 72), and a first edge region 74 around the first bridge region 73 (e.g. surrounding the first bridge region 73). The attachment substrate 51 comprises a cover region 91, a second border region 92 around the cover region 91 (e.g. surrounding the cover region 91), a second bridge region 93 around the second border region 92 (e.g. surrounding the second border region 92), and a second edge region 94 around the second bridge region 93 (e.g. surrounding the second bridge region 93). After the selective removal of the etch mask layer 56, the first bridge region 73, the inner region 71, the second bridge region 93, and the cover region 91, are left unprotected by the etch mask layer 56.

The stack 40 of FIG. 33 is processed to selectively remove portions of the supporting substrate 41 and the attachment substrate 51 that are left unprotected by the etch mask layer 56. The processing may performed for example as described above with reference to FIG. 16, using a wet etchant such as KOH. The inner region 71 and a first portion 73A of the first bridge region 73 in the supporting substrate 41 are selectively removed. The cover region 91 and a first portion 93A of the second bridge region 93 in the attachment substrate 51 are selectively removed. A second portion 73B of the first bridge region 73 is left behind and forms a first bridge. A second portion 93B of the second bridge region 93 is left behind and forms a second bridge. The first bridge connects the first edge region 74 to a remaining part of the supporting substrate 41 within the first edge region 74. The second bridge connects the second edge region 94 to a remaining part of the attachment substrate 51 within the second edge region 94.

Figure 35:
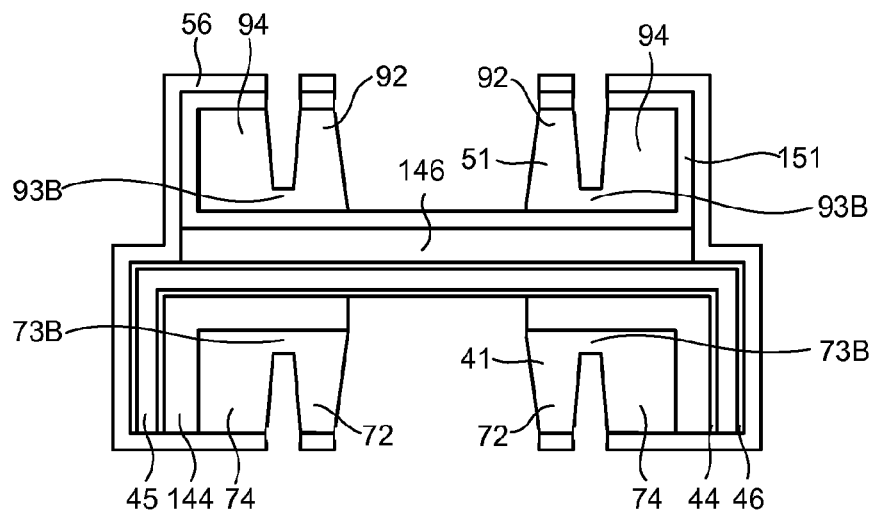

A portion of the lower etch bather 144 underneath the membrane layer 45 is removed using any suitable process to provide the membrane assembly 80 of FIG. 35.

Figure 36:
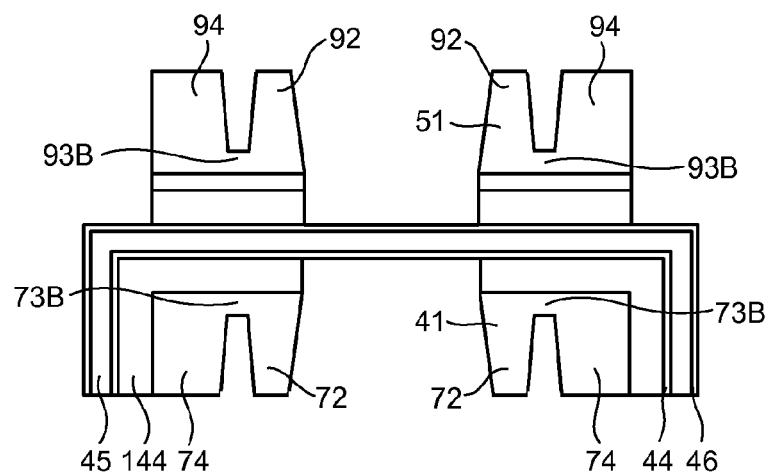

The remainder of the etch mask layer 56, the attachment substrate sacrificial layer 151, and a portion of the upper etch barrier 146 above the membrane layer 45 are removed to release the membrane and provide the membrane assembly 80 of FIG. 36.

Figure 37:
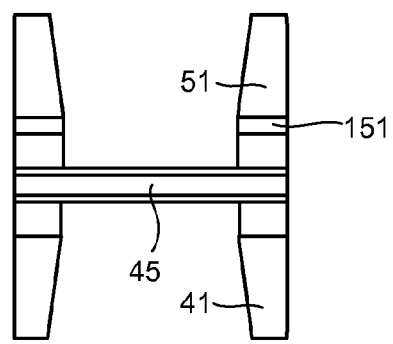
Figure 38:
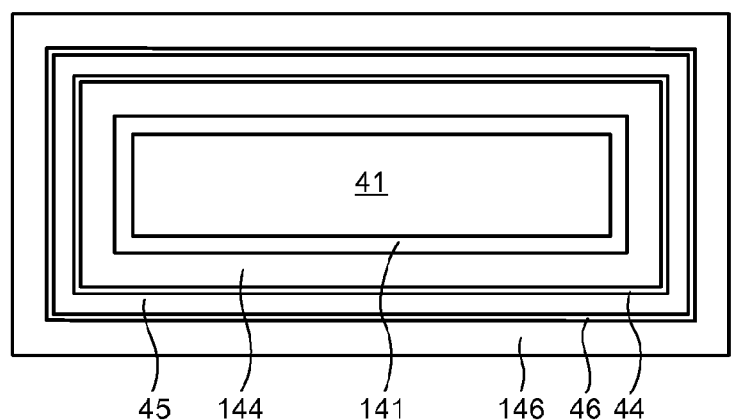
FIGS. 38 to 45 schematically depict stages of an alternative method for manufacturing a pellicle according to an embodiment of the invention.
Figure 39:
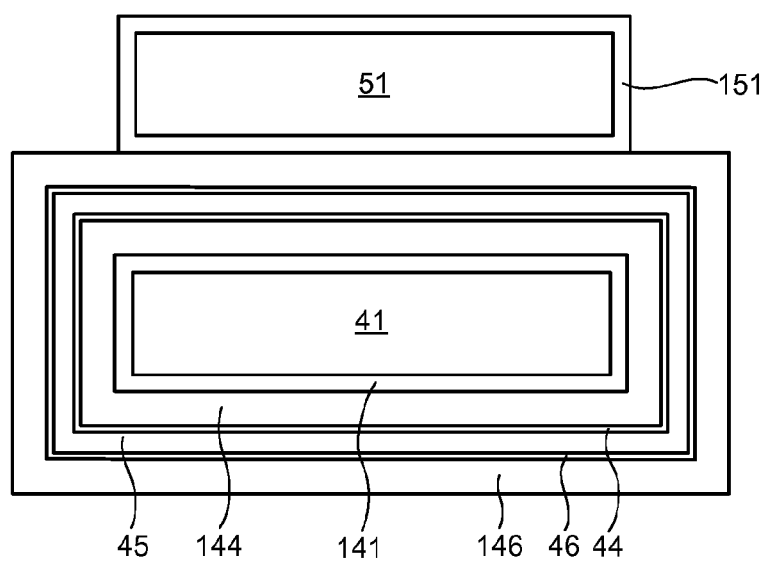
Figure 40:
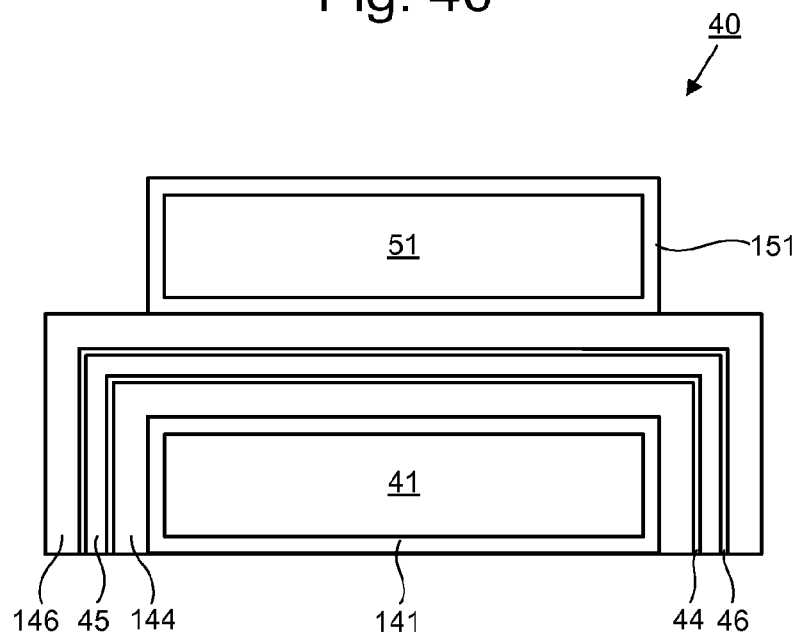

The membrane assembly 80 is then processed to form the membrane assembly shown in FIG. 37. The processing comprises separating the first edge region 74 and the second edge region 94, and layers formed thereon, from the membrane assembly 80. This processing may be referred to as dicing. The processing is achieved by cutting or breaking either or both of the first bridge and the second bridge.

In an embodiment, the first bridge and the second bridge are broken by applying a mechanical stress to the membrane assembly 80. In an alternative embodiment, the bridge is broken by cutting through the bridge using a laser. Debris removal tools, sometimes referred to as flake removal tools, may be used to remove any debris or flakes that are generating during the breaking of either or both of the first bridge and the second bridge. The debris removal tools may apply suction during the breaking for example.

The inventors have found that forming a membrane assembly 80 using either or both of 1) a first bridge in which the supporting substrate 41 is not completely etched through (e.g. such that a second portion 73B of the bridge region 73 remains) and 2) a second bridge in which the attachment substrate 51 is not completely etched through (e.g. such that a second portion 93B of the second bridge region 93 remains) reduces a fragility at the edges of the membrane assembly 80 and reduces or avoids generation of debris or flakes. It is believed the reduction in fragility is related to reducing a thinning of material of the supporting substrate 41, attachment substrate 5, or both, where the side surfaces of the supporting substrate 41, attachment substrate 51, or both, meet a surface closest to the membrane layer 45. Etching tends to progress at an oblique angle relative to the vertical direction (e.g. about 54 degrees). When the etching is allowed to progress completely through a substrate, the oblique angle provides a thin, wedge-like shape where the side surfaces meet the planar surface. Where the substrate is not completely etched through, this thinning is reduced or avoided. For example, where breaking of the first bridge or second bridge involves splitting along a near vertical line, the side surfaces meet the surface closest to the membrane layer 45 at approximately 90 degrees and no thinning occurs (except the thinning associated with the removal of the first portion 73A of the first bridge region 73 and the removal of the first portion 93A of the second bridge region 93).

FIG. 38-45 schematically depict stages of a method of manufacturing the membrane assembly according to an embodiment. This embodiment is a variation on the embodiment discussed above with reference to FIGS. 30-37. The processing steps corresponding to FIGS. 38-45 are the same as the processing steps corresponding to FIGS. 30-37 except for the following. Firstly, compared with the stack 40 of FIG. 30, the stack 40 of FIG. 38 additionally comprises a supporting substrate sacrificial layer 141 around the supporting substrate 41. Secondly, the step of coating with an etch mask layer 56 is omitted. Thus, the stack 40 of FIG. 40 differs from the stack 40 of FIG. 32 in that the etch mask layer 56 is omitted. Subsequently, instead of selectively removing the etch mask layer 56, as described above with reference to FIG. 33, in the present embodiment the attachment substrate sacrificial layer 151 and the supporting substrate sacrificial layer 141 are selectively removed to provide the stack shown in FIG. 41. Openings in the attachment substrate sacrificial layer 151 and the supporting substrate sacrificial layer 141 expose the regions of the supporting substrate 41 and attachment substrate 51 to be selectively removed. Subsequent processing then follows as described above with reference to FIGS. 34 to 37 except that, due to the symmetry of layers above and below the membrane layer 45, instead of requiring two separate steps to transition from FIG. 34 to FIG. 36, only a single step is required to transition between FIGS. 42 and 43. This step comprises removing a portion of the attachment substrate sacrificial layer 151 and upper etch barrier 146 above the membrane layer 45, and removing a portion of the supporting substrate sacrificial layer 141 and lower etch bather 144 below the membrane layer 45. From the arrangement of FIG. 43, the membrane assembly 80 can be processed as described above with reference to FIG. 37 to provide the membrane assembly 80 of FIG. 45. An alternative process flow is to dice the membrane assembly 80 of FIG. 42 before removal of the portion of the attachment substrate sacrificial layer 151 and upper etch barrier 146 above the membrane layer 45, and the portion of the supporting substrate sacrificial layer 141 and lower etch barrier 144 below the membrane layer 45, to provide the membrane assembly 80 of FIG. 44. Debris generated during the dicing may be less likely to be present on the membrane after all processing has been completed because the membrane layer 45 is covered with other layers during the dicing. The membrane assembly 80 is then processed to remove the portion of the attachment substrate sacrificial layer 151 and upper etch barrier 146 above the membrane layer 45, and the portion of the supporting substrate sacrificial layer 141 and lower etch barrier 144 below the membrane layer 45, to provide the membrane assembly 80 of FIG. 45. Relative to the embodiment of FIGS. 30-37 the embodiment of FIGS. 38-45 improves the symmetry of layers around the membrane layer 45. The attachment substrate sacrificial layer 151 and upper etch barrier 146 are present on one side of the membrane layer 45. The supporting substrate sacrificial layer 141 and lower etch barrier 144 are present on the other side of the membrane layer 45. The attachment substrate sacrificial layer 151 may have the same composition and/or thickness as the supporting substrate sacrificial layer 141. Additionally or alternatively, the upper etch barrier 146 may have the same composition and/or thickness as the lower etch barrier 144. As described above, supporting the membrane layer 45 symmetrically desirably ensures that the same or similar tensile or compressive forces are applied to each side of the membrane layer 45.

In all of the embodiments described above the selective removal of the supporting substrate 41 and the attachment substrate 51 is performed before dicing of the membrane assembly 80. This is not essential. Embodiments are discussed below with reference to FIGS. 46-52 in which dicing is performed earlier. Earlier dicing reduces the risk of debris generated by the dicing being present on the membrane layer 45 after all processing has been completed.

In an embodiment, the supporting substrate 41 comprises a first edge region 74 around a first border region 73. The processing of the stack 40 includes separating the first edge region 74 and layers formed on the first edge region 74 from the membrane assembly 80 before selectively removing the inner region 71 of the supporting substrate 41. In an embodiment, the attachment substrate 51 comprises a cover region 91, a second border region 92 around the cover region 91, and a second edge region 94 around the second border region 92. The processing of the stack 40 includes separating the second edge region 94 and layers formed on the second edge region 94 from the membrane assembly 80 before removing the cover region 91 of the attachment substrate 51.

In an embodiment, the separating of the first edge region 74 and layers formed on the first edge region 74 is performed simultaneously with the separating of the second edge region 94 and layers formed on the second edge region 94.

In an embodiment, starting from the stack 40 of FIG. 33, the stack 40 is diced to provide the stack 40 shown in FIG. 46. The inner region 71 and the cover region 91 are selectively removed to provide the membrane assembly 80 shown in FIG. 47. Processing analogous to the processing used to provide the membrane assembly 80 shown in FIG. 34 from the membrane assembly 80 shown in FIG. 33 may be used for example.

The membrane assembly 80 is processed further, analogously to the processing described above with reference to FIGS. 35-36, to provide the membrane assemblies 80 of FIGS. 48 and 49. The lower etch barrier 144, upper etch barrier 146, and the attachment substrate sacrificial layer 151 are removed, thereby releasing the membrane layer 45.

Figure 41:
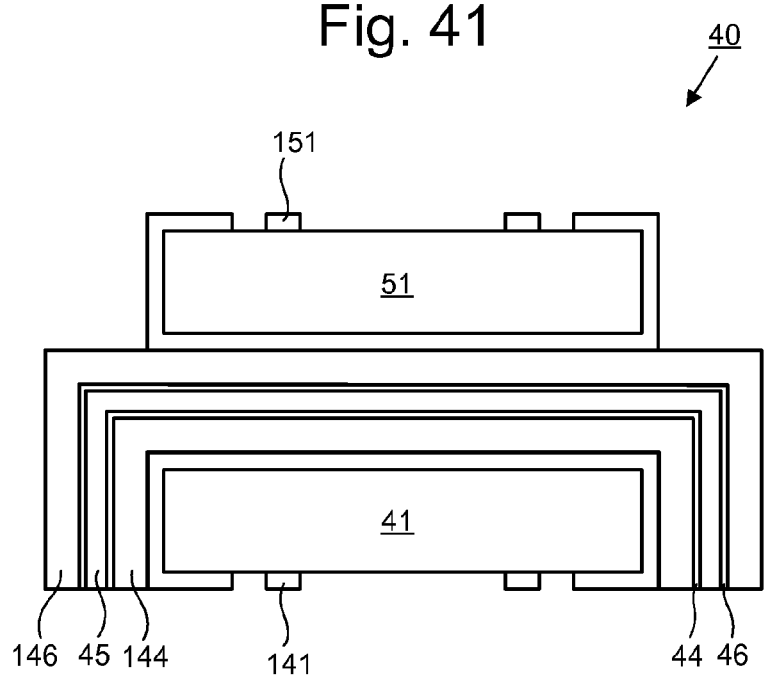
Figure 42:
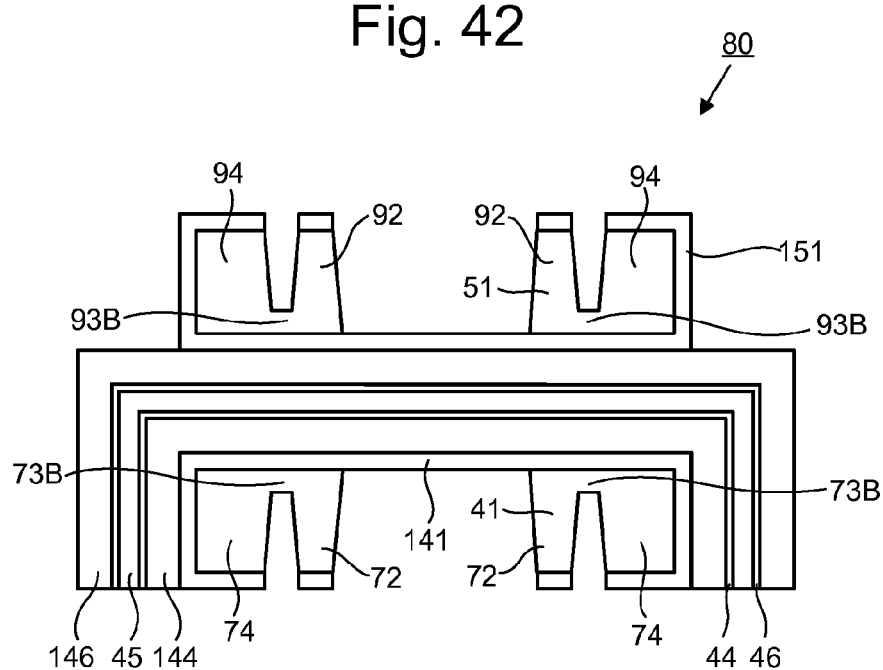
Figure 43:
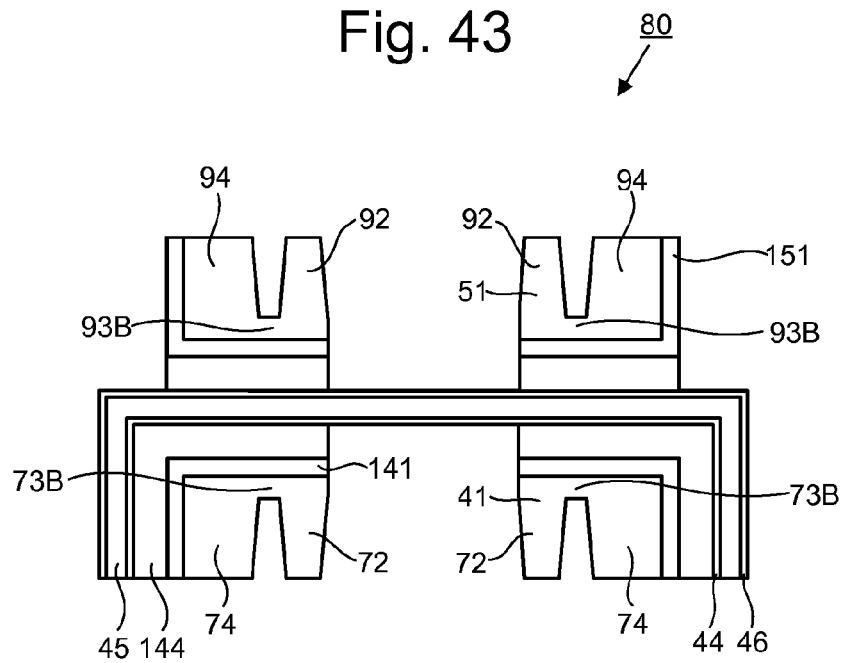
Figure 44:
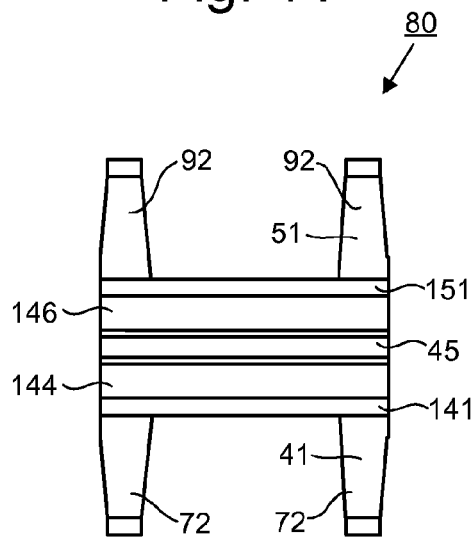
Figure 45:
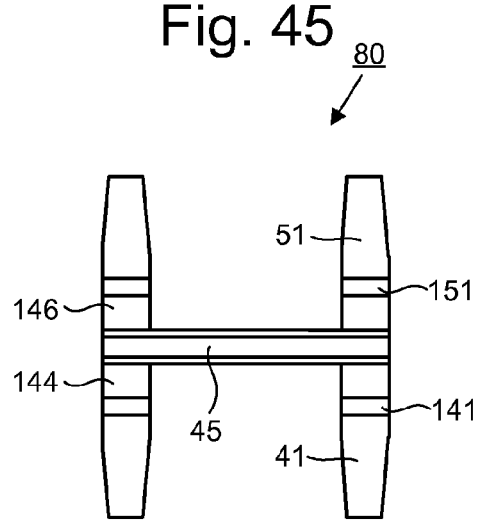

In an alternative embodiment, starting from the stack 40 of FIG. 41, the stack 40 is diced to provide the stack 40 shown in FIG. 50. The inner region 71 and the cover region 91 are then selectively removed to provide the membrane assembly 80 shown in FIG. 51. In a subsequent step, the supporting substrate sacrificial layer 141, lower etch barrier 144, upper etch barrier 146, and attachment substrate sacrificial layer 151 are removed to provide the membrane assembly 80 shown in FIG. 52. This embodiment benefits from the improved symmetry of layers around the membrane layer 45 discussed above with reference to FIGS. 38-45.

Embodiments are provided according to the following number clauses:

1. A method for manufacturing a membrane assembly for EUV lithography, the method comprising:
    providing a stack comprising a membrane layer between a supporting substrate and an attachment substrate, wherein the supporting substrate comprises an inner region and a first border region; and
    processing the stack, including selectively removing the inner region of the supporting substrate, to form a membrane assembly comprising:
        a membrane formed from at least the membrane layer, and
        a support holding the membrane, the support formed at least partially from the first border region of the supporting substrate.
2. The method of clause 1, comprising bonding the attachment substrate directly or indirectly to the membrane layer so as to provide the stack comprising the membrane layer between the supporting substrate and the attachment substrate.
3. The method of clause 2 wherein the bonding of the attachment substrate to the membrane layer is done via a wafer bonding technique.
4. The method of any preceding clause, wherein:
    the attachment substrate comprises a cover region and a second border region; and
    processing the stack includes removing at least the cover region of the attachment substrate.
5. The method of clause 4, wherein the selective removal of the inner region of the supporting substrate and the removal of at least the cover region of the attachment substrate are performed simultaneously.
6. The method of any of clauses 4 and 5, wherein:
    the selective removal of the inner region of the supporting substrate is performed using an etchant; and
    the removal of at least the cover region of the attachment substrate is performed using said etchant.
7. The method of any of clauses 4 to 6, wherein the cover region of the attachment substrate is selectively removed such that the support of the membrane assembly is formed partially from the second border region of the attachment substrate.
8. The method of any of clauses 4 to 6, wherein the second border region of the attachment substrate is removed together with the cover region.
9. The method of any preceding clause, wherein the supporting substrate has a chemical composition and the attachment substrate has said chemical composition.
10. The method of any preceding clause, wherein an average thickness of the attachment substrate is within 20% of an average thickness of the supporting substrate.
11. The method of any preceding clause, wherein the attachment substrate is attached directly to a layer of the stack that at least partially forms the membrane of the membrane assembly.

12. The method of clause 11, wherein the attachment substrate is attached directly to the membrane layer.
13. The method of any of clauses 1 to 10, wherein:
the stack comprises an adhesion layer between the membrane layer and the attachment substrate; and
the attachment substrate is attached to the adhesion layer.
14. The method of any preceding clause, wherein a sum of an average thickness of the supporting substrate and an average thickness of the attachment substrate is at least 700 µm.
15. The method of any preceding clause, wherein an average thickness of the attachment substrate is at most 500 µm.
16. The method of any preceding clause, wherein an average thickness of the supporting substrate is at most 500 µm.
17. The method of any of clauses 1 to 15, wherein an average thickness of the supporting substrate is at least 700 µm.
18. The method of any preceding clause, wherein at least one of the supporting substrate and the attachment substrate comprises an oxidized layer facing the membrane layer in the stack.
19. The method of any preceding clause, wherein:
the stack comprises a lower capping film between the supporting substrate and the membrane layer; and
the lower capping film forms part of the membrane of the membrane assembly.
20. The method of any preceding clause, wherein:
the stack comprises an upper capping film between the membrane layer and the attachment substrate; and
the upper capping film forms part of the membrane of the membrane assembly.
21. The method of any of clauses 1 to 18, comprising applying a lower capping film to a surface of the membrane layer that is exposed after selective removal of the inner region of the supporting substrate, such that the lower capping film forms part of the membrane of the membrane assembly.
22. The method of any of clauses 1 to 18 and 21, comprising applying an upper capping film to a surface of the membrane layer that is exposed after removal of at least the cover region of the attachment substrate, such that the upper capping film forms part of the membrane of the membrane assembly.
23. The method of any preceding clause, wherein:
the supporting substrate further comprises a first edge region around the first border region; and
processing the stack includes separating the first edge region, and layers formed on the first edge region, from the membrane assembly before selectively removing the inner region of the supporting substrate.
24. The method of clause 23, wherein:
the attachment substrate comprises a cover region, a second border region, and a second edge region around the second border region; and
processing the stack includes separating the second edge region, and layers formed on the second edge region, from the membrane assembly before removing the cover region of the attachment substrate.
25. The method of clause 24, wherein the separating of the first edge region and layers formed on the first edge region is performed simultaneously with the separating of the second edge region and layers formed on the second edge region.
26. The method of any preceding clause, wherein:
prior to the selective removal of the inner region of the supporting substrate, the supporting substrate further comprises a first bridge region around the first border region and a first edge region around the first bridge region; and processing the stack includes selectively removing a first portion of the first bridge region to form a first bridge, and separating the first edge region from the membrane assembly by cutting or breaking the first bridge.
27. The method of clause 26, wherein:
prior to a removal of a cover region of the attachment substrate, the attachment substrate comprises the cover region, a second border region around the cover region, a second bridge region around the second border region, and a second edge region around the second bridge region;
processing the stack includes selectively removing a first portion of the second bridge region to form a second bridge, and separating the second edge region from the membrane assembly by cutting or breaking the second bridge.
28. The method of clause 27, wherein the cutting or breaking of the first bridge is performed simultaneously with the cutting or breaking of the second bridge.
29. A membrane assembly for EUV lithography, the membrane assembly comprising:
a membrane; and
a support holding the membrane, the support formed from a first border region of a supporting substrate and a second border region of an attachment substrate, wherein the membrane is between the first border region of the supporting substrate and the second border region of the attachment substrate;
wherein the support is formed by selectively removing an inner region of the supporting substrate and a cover region of the attachment substrate such that the first border region of the supporting substrate and the second border region of the attachment substrate remain.
30. The membrane assembly of clause 29, wherein the first border region of the supporting substrate has a chemical composition and the second border region of the attachment substrate has said chemical composition.
31. The membrane assembly of clause 29 or clause 30, wherein an average thickness of the second border region of the attachment substrate is within 20% of an average thickness of the first border region of the supporting substrate.
32. The membrane assembly of any of clauses 29 to 31, wherein the second border region of the attachment substrate is attached directly to the membrane of the membrane assembly.
33. The membrane assembly of any of clauses 29 to 31, wherein the second border region of the attachment substrate is attached to an adhesion layer between the membrane and the second border region of the attachment substrate.
34. The membrane assembly of any of clauses 29 to 33, wherein a sum of an average thickness of the first border region of the supporting substrate and an average thickness of the second border region of the attachment substrate is at least 700 µm.
35. The membrane assembly of any of clauses 29 to 34, wherein an average thickness of the first border region of the supporting substrate is at most 500 µm.
36. The membrane assembly of any of clauses 29 to 35, wherein an average thickness of the second border region of the attachment substrate is at most 500 µm.
37. The membrane assembly of any of clauses 29 to 36, wherein the attachment substrate is directly or indirectly bonded to the membrane layer so as to provide a stack comprising the membrane layer between the supporting substrate and the attachment substrate.
38. The membrane assembly of any of clauses 29 to 37, wherein the bonding of the attachment substrate to the membrane layer is a wafer bonding.

39. A patterning device assembly for EUV lithography comprising the membrane assembly of any of clauses 29 to 38.
40. A dynamic gas lock assembly for EUV lithography comprising the membrane assembly of any of clauses 29 to 38.
41. A method for manufacturing a membrane assembly for a lithographic apparatus, the method comprising:
   providing a supporting substrate with a membrane layer;
   bonding an attachment substrate to the supporting substrate provided with the membrane layer to form a stack, wherein the membrane layer is encapsulated between the supporting substrate and the attachment substrate; and
   processing the stack, including selectively removing at least a region of the attachment substrate and/or the supporting substrate, to form a membrane assembly comprising:
      a membrane formed from at least the membrane layer; and
      a support holding the membrane, the support formed at least partially from a first border region of the supporting substrate.
42. The method according to clause 41 wherein the bonding of the attachment substrate to the stack is provided via a wafer-bonding technique.
43. A method for manufacturing a membrane assembly for a lithographic apparatus, the method comprising:
   providing a supporting substrate having an average thickness of at least 600 μm with a membrane layer;
   wafer bonding an attachment substrate having an average thickness of less than 500 μm to the supporting substrate provided with the membrane layer to form a stack, wherein the membrane layer is encapsulated between the supporting substrate and the attachment substrate;
   subsequently thinning the supporting substrate bonded to the attachment substrate to an average thickness of the supporting substrate to be less than 500 μm.
44. The method according to clause 43 wherein the thickness of the supporting substrate and the thickness of the attachment substrate are substantially equal.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. . . . . . The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the various photo resist layers may be replaced by non-photo resist layers that perform the same function.

The descriptions above are intended to be illustrative, not limiting. Thus it will be apparent to one skilled in the art that modifications may be made to the invention as described without departing from the scope of the claims set out below.

The invention claimed is:

1. A method for manufacturing a membrane assembly for EUV lithography, the method comprising:
   providing a stack comprising a membrane layer between a supporting substrate and an attachment substrate, wherein the supporting substrate comprises an inner region and a first border region;
   processing the stack, including selectively removing a portion of the attachment substrate and selectively removing the inner region of the supporting substrate, to form a membrane assembly comprising:
      a membrane formed from at least the membrane layer; and
      a support holding the membrane, the support formed at least partially from the first border region of the supporting substrate.

2. The method of claim 1, comprising bonding the attachment substrate directly or indirectly to the membrane layer so as to provide the stack comprising the membrane layer between the supporting substrate and the attachment substrate.

3. The method of claim 2, wherein the bonding of the attachment substrate to the membrane layer is done via a wafer bonding technique.

4. The method of claim 1, wherein:
   the attachment substrate comprises a cover region and a second border region; and
   processing the stack includes removing at least the cover region of the attachment substrate.

5. The method of claim 4, wherein the selective removal of the inner region of the supporting substrate and the removal of at least the cover region of the attachment substrate are performed simultaneously.

6. The method of claim 4, wherein the cover region of the attachment substrate is selectively removed such that the support of the membrane assembly is formed partially from the second border region of the attachment substrate.

7. The method of claim 4, wherein the second border region of the attachment substrate is removed together with the cover region.

8. The method of claim 1, wherein the supporting substrate has a chemical composition and the attachment substrate has the essentially same chemical composition.

9. The method of claim 1, wherein the attachment substrate is attached directly to a layer of the stack that at least partially forms the membrane of the membrane assembly.

10. A membrane assembly for EUV lithography, the membrane assembly comprising:
   a membrane; and
   a support holding the membrane, the support formed from a first border region of a supporting substrate and a second border region of an attachment substrate, wherein the membrane is between the first border region of the supporting substrate and the second border region of the attachment substrate and wherein there is an aperture extending in a direction across a first surface of the membrane between portions of the first border region of the supporting substrate and an aperture extending in a direction across a second surface of the membrane between portions of the second border region of the attachment substrate.

11. The membrane assembly of claim 10, wherein the second border region of the attachment substrate is attached directly to the membrane of the membrane assembly.

12. The membrane assembly of claim 10, wherein the second border region of the attachment substrate is attached to an adhesion layer between the membrane and the second border region of the attachment substrate.

13. The membrane assembly of claim 10, wherein the attachment substrate is directly or indirectly bonded to the membrane layer so as to provide a stack comprising the membrane layer between the supporting substrate and the attachment substrate.

14. The membrane assembly of claim 13, wherein the bonding of the attachment substrate to the membrane layer is a wafer bonding.

15. A patterning device assembly for EUV lithography comprising the membrane assembly of claim 10.

16. A dynamic gas lock assembly for EUV lithography comprising the membrane assembly of claim 10.

17. A method for manufacturing a membrane assembly for a lithographic apparatus, the method comprising:
   providing a supporting substrate with a membrane layer;
   bonding an attachment substrate to the supporting substrate provided with the membrane layer to form a stack, wherein the membrane layer is at least sandwiched between the supporting substrate and the attachment substrate; and
   processing the stack, including etching the attachment substrate and selectively removing at least a region of the supporting substrate, to form a membrane assembly comprising:
      a membrane formed from at least the membrane layer, and
      a support holding the membrane, the support formed at least partially from a border region of the supporting substrate.

18. The method according to claim 17, wherein the bonding of the attachment substrate to the stack is provided via a wafer-bonding technique.

19. A method for manufacturing a membrane assembly for a lithographic apparatus, the method comprising:
   providing a supporting substrate having an average thickness of at least 600 μm with a membrane layer;
   wafer bonding an attachment substrate having an average thickness of less than 500 μm to the supporting substrate provided with the membrane layer to form a stack, wherein the membrane layer is at least sandwiched between the supporting substrate and the attachment substrate; and
   subsequently thinning the supporting substrate bonded to the attachment substrate to an average thickness of the supporting substrate to be less than 500 μm.

20. The method according to claim 19, wherein the thickness of the thinned supporting substrate and the thickness of the attachment substrate are substantially equal.

* * * * *